US007658798B2

(12) United States Patent
Ishida et al.

(10) Patent No.: US 7,658,798 B2
(45) Date of Patent: Feb. 9, 2010

(54) METHOD FOR FIXING METAL PARTICLES AND METHOD FOR MANUFACTURING SUBSTRATE CONTAINING METAL PARTICLES, METHOD FOR MANUFACTURING SUBSTRATE CONTAINING CARBON NANOTUBE, AND METHOD FOR MANUFACTURING SUBSTRATE CONTAINING SEMICONDUCTOR-CRYSTALLINE ROD, EMPLOYING THEREOF

(75) Inventors: Masahiko Ishida, Tokyo (JP); Hiroo Hongo, Tokyo (JP); Jun-ichi Fujita, Tokyo (JP)

(73) Assignee: NEC Corporation, Tokyo (JP)

( * ) Notice: Subject to any disclaimer, the term of this patent is extended or adjusted under 35 U.S.C. 154(b) by 527 days.

(21) Appl. No.: 10/564,750

(22) PCT Filed: Jul. 20, 2004

(86) PCT No.: PCT/JP2004/010301

§ 371 (c)(1),
(2), (4) Date: Jan. 17, 2006

(87) PCT Pub. No.: WO2005/007564

PCT Pub. Date: Jan. 27, 2005

(65) Prior Publication Data

US 2007/0104892 A1    May 10, 2007

(30) Foreign Application Priority Data

Jul. 18, 2003    (JP) .............................. 2003-276482

(51) Int. Cl.
*C30B 25/12* (2006.01)

(52) U.S. Cl. .............................. 117/95; 117/84; 117/89; 117/97

(58) Field of Classification Search .................. 117/84, 117/89, 95, 97
See application file for complete search history.

(56) References Cited

U.S. PATENT DOCUMENTS 4,604,294 A * 8/1986 Tanaka et al. ............... 427/509

FOREIGN PATENT DOCUMENTS

| JP | 10-167893 A | 6/1998 |
| JP | 11-139815 A | 5/1999 |
| JP | 2002-29717 A | 1/2002 |
| JP | 2002-139467 A | 5/2002 |
| JP | 2002-285335 A | 10/2002 |
| JP | 2003-158093 A | 5/2003 |
| JP | 2003-168745 A | 6/2003 |

OTHER PUBLICATIONS

N. I. Maksimova, et al. "Preparation of Nanoscale Thin-Walled Carbon Tubules From a Polyethylene Precursor," Carbon, 1999, vol. 37, No. 10, pp. 1657-1661.
N. I. Maksimova, et al. "Preparation of Nanoscale Thin-Walled Carbon Tubules From a Polyethylene Precursor," Carbon, vol. 37, No. 10, 1999.

* cited by examiner

*Primary Examiner*—Felisa C Hiteshew
(74) *Attorney, Agent, or Firm*—Sughrue Mion, PLLC

(57) ABSTRACT

A metal fine particle is adhere to a predetermined location on a substrate. A resist film containing a metallic compound dispersed therein is formed on a substrate (101). A patterning of the resist film is conducted by a lithography. The substrate (101) having the patterned resist formed thereon is heated within an oxygen atmosphere to adhere a metal fine particle (106) to the surface of the substrate (101), while removing the resin in the patterned resist.

31 Claims, 13 Drawing Sheets

METHOD FOR FIXING METAL PARTICLES AND METHOD FOR MANUFACTURING SUBSTRATE CONTAINING METAL PARTICLES, METHOD FOR MANUFACTURING SUBSTRATE CONTAINING CARBON NANOTUBE, AND METHOD FOR MANUFACTURING SUBSTRATE CONTAINING SEMICONDUCTOR-CRYSTALLINE ROD, EMPLOYING THEREOF

This is a PCT National Stage Application under 35 U.S.C. § 371 of Application No. PCT/JP04/10301 filed Jul. 20, 2004.

TECHNICAL FIELD

The present invention relates to a method for fixing metal particles and a method for manufacturing a substrate containing metal particles, a method for manufacturing a substrate containing carbon nanotube, and a method for manufacturing a substrate containing semiconductor-crystalline rod, employing thereof.

BACKGROUND ART

In recent years, efforts for applying carbon nanotube to electronic devices is actively examined. In order to manufacture such electronic devices, it is necessary to fix carbon nanotube onto a substrate. Typically, processes for obtaining such condition includes a process for fixing the prepared carbon nanotube onto substrate, and a process for adhering metal fine particles that function as a catalyst on a substrate, and allowing a growth of the carbon nanotubes from the metal fine particles.

In these processes, the latter process is beneficial in that a carbon nanotube can be ensured to be disposed at a desired location. When the process for adhering such metal fine particles is adopted, it is required that the metal fine particles should be adhered at desired locations on the substrate with higher controllability. In addition, since the diameter of the formed carbon nanotube is determined by the diameter of the metal fine particles, a critical technical problem would be a reduction in the size of the metal fine particles. More specifically, manufacturing of fine particles having a particle size on the order of the diameter of the carbon nanotube, namely 0.4 nm to several nm, is required, and in particular, a technology for manufacturing fine particles having a minimum size of equal to or less than 1 nm is required.

Patent literature 1 describes a method for providing a pattern of metal fine particles on a substrate. The patent literature describes a technology for aggregating from an aqueous solution containing a metal catalyst ion to form the metal catalyst cluster, by diffusing the aqueous solution containing a metal catalyst ion in a predetermined region on a substrate, and then conducting an annealing process. However, it is difficult to control the size of the fine particles at a level of several nm in this process. Further, it is also difficult to control the quantity of the adhered fine particles.

Meanwhile, dots of a metal can be manufactured on a substrate by employing a fine processing technology for semiconductors. However, the processing dimension is a dot pattern of about 10 nm at minimum, even if the electron beam lithography, which is a fine processing method, is employed, for example. Consequently, the manufacture of a pattern of equal to or less than 10 nm has been conventionally difficult.

On the other hand, a laser ablation process, processes for precipitating metals from a raw material dispersed into a gas phase or a liquid phase or the like have been conventionally employed as a process for manufacturing metal fine particles having a size of equal to or less than 10 nm. Fine particles having particle diameters of equal to or less than 10 nm can be easily obtained by employing these methods. However, it has been difficult to manufacture the metal fine particles at specified locations on the substrate by employing these methods. Consequently, a secondary process for disposing the fine particles on the substrate is required, in addition to the process for manufacturing the fine particles.

[Patent Literature 1]

Japanese Patent Laid-Open No. 2003-168,745

DISCLOSURE OF THE INVENTION

As such, it has been difficult to dispose a predetermined number of metal fine particles having predetermined dimensions at predetermined locations on the substrate by conventional technologies. The present invention has been conceived in view of the foregoing situation, and it is an object of the present invention to provide a technology for adhering metal fine particles onto predetermined locations on the substrate. It is another object of the present invention to provide a technology for adhering metal fine particles onto the substrate with an improved controllability.

According to one aspect of the present invention, there is provided a method for fixing a metal particle, including: forming a resist film containing a resin component and a metal-containing particle on a substrate; and removing the resin component in the resist film and fixing a metal particle on the substrate, the metal particle including a metallic element that composes the metal-containing particle.

The present invention employs a procedure, in which the metal-containing particle is added in resist film that is capable of being fine-processed, and after forming a fine pattern, the metal particle is formed in the pattern. As a result, a metal particle that is considerably smaller than the fine pattern can be formed only at a target location according to the quantity of the added metal.

In addition, the resin component in resist film is removed, and the metal particle composed of metallic element that composes metal-containing particle is fixed on the substrate. Consequently, the metal particle can be transferred within the resist film to be surely fixed on the substrate, while removing the resin component. Accordingly, the metal particle can be fixed in a form of a fine particle at a predetermined location on the substrate. In addition, the surface of the metal particle can be exposed by removing the resin component.

As such, according to the present invention, the metal particle can be easily disposed in the fine region and can also simultaneously be processed into a dimension that is equal to or smaller than a minimum processing dimension of the conventional fine processing technology. Meanwhile, in the present invention, particle diameter or number of the metal particles fixed on the substrate can be controlled by adjusting the concentration of the metallic element in the resist film.

In the present invention, the metal-containing particle contains a particle of a metal and a metallic compound. In addition, a surface layer such as a surfactant may be adhered onto the surface of the metal particles.

According to another aspect of the present invention, there is provided a method for fixing a metal particle, including: forming a pattern containing a metal component by irradiating charged particle beam onto a substrate within an organic molecular gas atmosphere containing organometallic molecule to deposit a decomposition product of the organic molecular gas containing the metal component in the region where the charged particle beam is irradiated; and removing the organic constituent in the pattern and fixing a metal particle containing the metal component on the substrate.

In the method for fixing according to the present invention, a pattern containing a metal component can be formed only in a desired region, by irradiating a charged particle beam over the desired region on the substrate. Consequently, the metal component can be surely deposited in the desired region on the substrate. Further, since the method for fixing according to the present invention includes fixing the metal particle onto the substrate, the target fine particle of the metal component can be surely disposed in the desired region.

In the present invention, electron or ion, for example, may be employed for the charged particle. Having such configuration, the pattern can be surely formed. Further, in the present invention, the particle diameter or number of the metal particle fixed on the substrate can be controlled by adjusting the concentration of the metallic element in the pattern.

In the method for fixing the metal particle according to the present invention, the metal-containing particle may be a metallic compound. Having such configuration, the dispersibility of the metal-containing particles in the resist film can be improved. Thus, the particle diameter of the metal particle can be reduced.

The method for fixing the metal particle according to the present invention may further include heating the resist film to a temperature of 300 degree C. or higher and 1,200 degree C. or lower within an inert gas atmosphere or a vacuum, after the forming the resist film and before the removing the resin component and fixing the metal particle.

The method for fixing the metal particle according to the present invention may further include heating the pattern film to a temperature of 300 degree C. or higher and 1,200 degree C. or lower within an inert gas atmosphere or a vacuum, after the forming the pattern containing the metal component and before the fixing the metal particle on the substrate.

Having such configuration, the metal-containing particles can be aggregated. Thus, the diameter or number of the metal particles that are to be fixed on the substrate can be controlled according to the heating temperature or the heating time. The heating temperature may be preferably equal to or lower than 450 degree C., if a damage to the substrate, a reaction of the substrate material with the metal and the diffusion of the metal into the substrate material are to be inhibited.

In the method for fixing the metal particle according to the present invention, the aforementioned removing the resin component and fixing the metal particle may include exposing the resist film to a plasma atmosphere.

In the method for fixing the metal particle according to the present invention, the aforementioned removing the organic constituent in the pattern and fixing the metal particle may include exposing the pattern to a plasma atmosphere.

Having such configuration, the resin component in the resist film can be surely removed from the surface of the substrate. Further, in this operation, the metal particles can be transferred toward the surface of the substrate in the resist film or in the pattern. Consequently, the metal particles can be surely fixed onto the surface of the substrate. Further, the surface of metal particle can be surely exposed. In order to effectively remove the carbon resin and to prevent removing metals, it is preferable to expose thereof in an oxygen plasma atmosphere.

In the method for fixing the metal particle according to the present invention, the aforementioned removing the resin component and fixing the metal particle may include heating to a temperature of 300 degree C. or higher and 1,200 degree C. or lower within an oxygen gas atmosphere.

Further, in the method for fixing the metal particle according to the present invention, the aforementioned removing the organic constituent in the pattern and fixing the metal particle may include heating the pattern to a temperature of 300 degree C. or higher and 1,200 degree C. or lower within an oxygen gas atmosphere.

Having such configuration, the combustion of the resin component in the resist film can be surely achieved to remove thereof from the surface of the substrate. Further, in this operation, the metal particles can be transferred toward the surface of the substrate in the resist film or in the pattern. Consequently, the metal particles can be surely fixed onto the surface of the substrate. Further, the surface of metal particle can be surely exposed. Further, in the present invention, the size or number of the metal particles fixed on the surface of the substrate can be controlled by adjusting the heating temperature or the heating time.

In the method for fixing the metal particle according to the present invention, the aforementioned resist film may be a negative-type resist film. Having such configuration, molecular weight of the resin component in the resist film can be increased according to the exposure. Consequently, a deterioration and/or a combustion of the resist film can be inhibited in the operation for aggregating the metal-containing particles. Thus, the metal particles can more surely fixed in a desired location on the substrate.

In the method for fixing the metal particle according to the present invention, the resist film may be formed so as to cover the region where the metal particle is to be fixed, and the metal-containing particles in the resist film may be aggregated to fix the metal particle to the region.

Further, in the method for fixing the metal particle according to the present invention, the pattern may be formed so as to cover the region where the metal particle is to be fixed, and the metal-containing particles in the pattern may be aggregated to fix the metal particle to the region.

Having such configuration, the metal particles can be aggregated in a desired region on the substrate so as to have the desired particle diameter, and a desired number of metal particles can be surely fixed on the desired region. Here, in the present invention, a particle diameter of one of the metal particles fixed on the substrate, can be controlled by adjusting the concentration of the metallic element in the resist film or in the pattern. Further, when an operation for heating the resist film or the pattern is contained therein, the particle diameter of the metal particle can also be controlled by adjusting the heating temperature or the heating time.

In the method for fixing the metal particle according to the present invention, the aforementioned forming the patterned resist may include patterning the resist film by a lithography. Having such configuration, the patterned resist can be further stably formed.

The method for fixing the metal particle according to the present invention may further include providing an electrode so as to contact with the metal particle, after fixing the metal particle. More specifically, a method for depositing the metallic film under the condition that a mask, which is provided with an opening in the region provided with the metal particle, is formed, or the like may be included. It was difficult to dispose a carbon nanotube so as to surely contact with the electrode in the prior art, and the aspect has been a critical technical issue. According to the above-described configuration, the carbon nanotube can surely contact with the electrode.

In the method for fixing the metal particle according to the present invention, the substrate may contain an electrode having an exposed surface, and the aforementioned fixing the metal particle on the substrate may include fixing the metal particle on the surface of the electrode. Having such configuration, the metal particle can be preferably fixed onto the surface of the electrode. Further, the carbon nanotubes or the like can be formed in a self-aligning arrangement by allowing the growth of the carbon nanotubes from the fixed metal particles to provide junctions between the electrodes. In the present invention, the electrode may be made of a metal. Having such configuration, the metal particle can further surely be fixed onto the surface of the electrode.

In the method for fixing the metal particle according to the present invention, the aforementioned fixing the metal particle on the surface of the electrode may include aggregating the metal-containing particles in the resist film to fix the metal particle on the surface of the electrode.

In the method for fixing the metal particle according to the present invention, the aforementioned fixing the metal particle on the surface of the electrode may include aggregating the metal component in the pattern to fix the metal particle on the surface of the electrode.

Having such configuration, the metal particles having desired particle diameters can be aggregated onto the electrode to provide a desired number thereof, thereby surely fixing thereon.

In the method for fixing the metal particle according to the present invention, the metal particle may be one and be fixed. Having such configuration, metal particle can be aggregated in the desired region on the substrate, thereby surely being fixed as one particle. Here, in the present invention, the particle diameter of the one metal particle fixed on the substrate may be controlled by adjusting the concentration of the metal component in the resist film or the pattern. In addition, when an operation for heating the resist film or the pattern is contained therein, the particle diameter of the metal particle can also be controlled by adjusting the heating temperature or the heating time.

The method for fixing the metal particle according to the present invention may further include forming a diffusion barrier film on the substrate before the forming the resist film, and the aforementioned fixing the metal particle on the substrate may include fixing the metal particle on the diffusion barrier film. Having such configuration, the diffusion of the metallic element included in the metal-containing particle in the substrate can be inhibited. Further, the metal particles can be more surely fixed on the substrate via a diffusion barrier film.

According to the present invention, a method for manufacturing a metal particle-containing substrate including the aforementioned methods for fixing the metal particle may be presented.

According to the manufacturing method according to the present invention, the metal particles can be fixed onto the surface of the substrate in a form of fine particles. Further, it is formed only in a region where the patterned resist or the pattern is formed. Consequently, the metal particle containing substrate that has metal particles of a desired number or having a desired dimension fixed in desired locations can be stably manufactured.

In the method for manufacturing the metal particle-containing substrate according to the present invention, a mean particle diameter of the metal particles may be 0.1 nm or more and 10 nm or less. Having such configuration, it can preferably be employed in a device including a fine structure.

The metal particle-containing substrate obtained by the manufacturing method of the present invention may be employed as a catalyst for allowing a growth of a semiconductor crystal rod or a growth of a carbon nanotube. Further, it may also be employed for applications such as a mask for etching, an electronic reservoir for a single electron transistor, a dot for a quantum optical device and the like. Further, it can be applied for a display unit application by additionally employing a transparent substrate such as a glass and the like.

According to further aspect of the present invention, there is provided a catalyst-adhered substrate, wherein a plurality of electrode is provided on the substrate, wherein a predetermined number of catalyst metal particles are adhered onto the electrodes, respectively, and wherein a mean particle diameter of the catalyst metal particles is 0.1 nm or more and 10 nm or less.

According to yet other aspect of the present invention, there is provided a method for manufacturing a substrate containing a carbon nanotube on a surface thereof, including: fixing a metal particle on the substrate; and allowing a growth of a carbon nanotube by a vapor deposition process with a catalyst of the metal particle, wherein the aforementioned fixing the metal particle is conducted by the aforementioned methods for fixing the metal particle.

The manufacturing method according to the present invention includes the aforementioned methods for fixing the metal particles stated above. Consequently, a metal catalyst for allowing a growth of the carbon nanotube can be fixed in a form of fine particles in the desired location on the substrate. Consequently, the growth of the carbon nanotube from the desired location on the substrate can be allowed. Thus, the substrate containing the carbon nanotube on the surface thereof can be stably manufactured.

According to yet other aspect of the present invention, there is provided a method for manufacturing a substrate containing a carbon nanotube on a surface thereof, including: fixing a metal particle on the substrate; disposing an amorphous carbon resin so as to cover the metal particle; and transferring the metal particle in the amorphous carbon resin by heating the substrate having the amorphous carbon resin disposed thereon to allow a growth of the carbon nanotube in a region where the metal particle is transferred to form a locus, wherein the aforementioned fixing the metal particle is conducted by the aforementioned methods for fixing the metal particle.

In the manufacturing method according to the present invention, the aforementioned methods for fixing the metal particles stated above is included. Further, the operation of disposing the amorphous carbon resin so as to cover the metal particles is included. Consequently, the metal particles can be transferred within the amorphous carbon resin by heating the substrate. Thus, the carbon nanotube can grow in the amorphous carbon resin with a catalyst of the metal particle along the locus thereof. Since the metal particles can be disposed in the desired location on the substrate, the carbon nanotube can grow in the desired location on the substrate by employing this method.

According to yet other aspect of the present invention, there is provided a method for manufacturing a substrate containing a semiconductor crystal rod on a surface thereof, including: fixing a metal particle on the substrate; and allowing a growth of a crystalline rod of a semiconductor by a vapor deposition process with a catalyst of the metal particle, wherein the aforementioned fixing the metal particle is conducted by the aforementioned methods for fixing the metal particle.

The manufacturing method according to the present invention includes the aforementioned methods for fixing the metal particles stated above. Consequently, a metal catalyst for allowing the growth of the crystalline rod of the semiconductor can be fixed in a form of fine particles in the desired location on the substrate. Consequently, the crystalline rod of the semiconductor can grow from the desired location on the substrate. Thus, the substrate containing the crystalline rod of the semiconductor on the surface thereof can be stably manufactured.

In the method for manufacturing the substrate containing the semiconductor crystal rod according to the present invention, the metal particle may be Au particle. Having such configuration, the growth of the crystalline rod of the semiconductor can more surely be achieved. Further, in the method for manufacturing the substrate containing the semiconductor crystal rod according to the present invention, the semiconductor may be any of Si, Ge, GaAs, GaP, InAs, or InP.

It is to be understood that the invention is capable of use in various other combinations, modifications, and environments, and any other exchanging of the expression between the method and device or the like according to the present invention may be effective as an alternative of an embodiment according to the present invention.

As described above, according to the present invention, fine metal fine particles, which have not been able to be manufactured in the conventional lithography technique, can be manufactured. Further, according to the present invention, the manufactured metal fine particles can be easily disposed only in the target location.

BRIEF DESCRIPTION OF THE DRAWINGS

The above and other objects, features and advantages of the present invention will be more apparent from the following description on preferred embodiments and the annexed drawings, in which.

BEST MODE FOR CARRYING OUT THE INVENTION

Preferable embodiments according to the present invention will be described as follows in further detail, in reference to the annexed figures. In all figures, identical numeral is assigned to an element commonly appeared in the figures, and the detailed description thereof will not be presented in the following descriptions.

First Embodiment

Figure 1:
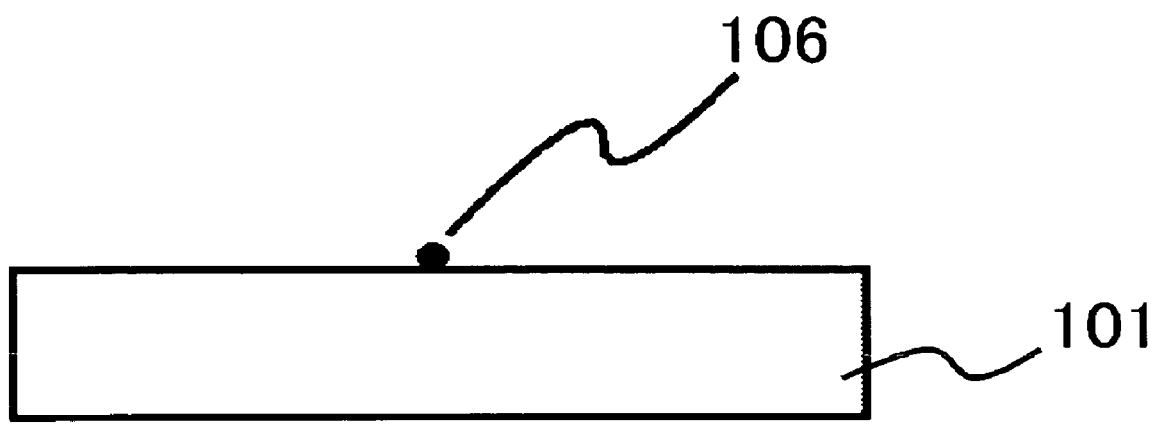
FIG. 1 is a cross-sectional view, schematically showing a configuration of metal fine particle-adhered substrate according to an embodiment.

The present embodiment relates to a metal fine particle-adhered substrate, which contains metal fine particles adhered onto the surface of the substrate. FIG. 1 is a cross-sectional view, schematically showing a configuration of the metal fine particle-adhered substrate according to the present embodiment.

A metal fine particle-adhered substrate of FIG. 1 includes a substrate 101 and a metal fine particle 106 that is adhered onto a surface of the substrate 101. Materials available for the substrate 101 is not particularly limited, and various materials such as silicon and the like may be selected according to an object. Further, various metals or alloys may be selected for the material of the metal fine particle 106 according to an object. As metallic elements that are available to be employed as the material of the metal fine particle 106 includes, for example, the following elements:

elements in periodic table group 3 such as yttrium (Y) and the like;

elements in periodic table group 4 such as titanium (Ti), hafnium (Hf) and the like;

elements in periodic table group 5 such as niobium (Nb), tantalum (Ta) and the like;

elements in periodic table group 6 such as chromium (Cr), molybdenum (Mo), tungsten (W) and the like;

elements in periodic table group 7 such as manganese (Mn) and the like;

elements in periodic table group 8 such as iron (Fe) and the like;

elements in periodic table group 9 such as cobalt (Co), rhodium (Rh) and the like;

elements in periodic table group 10 such as nickel (Ni), palladium (Pd), platinum (Pt);

elements in periodic table group 11 such as copper (Cu), silver (Ag), gold (Au) and the like;

elements in periodic table group 13 such as aluminum (Al), indium (In) and the like;

elements in periodic table group 14 such as germanium (Ge) and the like; and lanthanide series such as lanthanum (La), cerium (Ce), praseodymium (Pr), neodymium (Nd), gadolinium (Gd), terbium (Tb), dysprosium (Dy), holmium (Ho), erbium (Er), lutetium (Lu) and the like.

Figure 2:
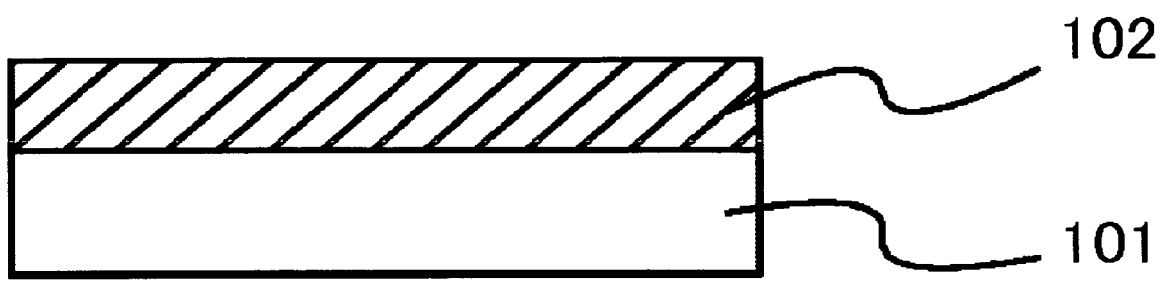
FIG. 2 is a cross-sectional view for describing a method for manufacturing the metal fine particle-adhered substrate according to the embodiment.

The metal fine particle-adhered substrate of FIG. 1 can be manufactured as indicated below. Descriptions will be made as follows in reference to FIG. 2 to FIG. 4. First of all, a resist film 102 is formed on the surface of the substrate 101, so as to cover a region where the metal fine particle 106 is to be fixed (FIG. 2).

The resist film 102 may be formed by applying a resist composition on the surface of the substrate 101 via a method such as spin coating and the like. Various components may be employed for the constitution of the resist composition. For example, a chemically amplified resist may be employed, and in such case, the resist composition may have a constitution containing a metal component composing the metal fine particle 106, a base resin, an acid-generating agent for generating an acid by being exposed and an organic solvent.

A negative-type resist for an electron beam lithography is preferably employed for the resist composition, for example. More specifically, calix arene-containing resist such as calix [n] arene, p-methyl-methyl acetoxy calix [n] arene, p-chloromethyl-methoxy calix [n] arene or the like ($4 \leq n \leq 8$ in any of the above); polystyrene-containing resist; silsesquioxane-containing resist or the like may be utilized. Further, a chemically amplified negative-type resist such as, for example, "NEB resist" (commercially available from Sumitomo Chemical Co., Ltd) may also be employed.

Molecular weight of a crosslinking substance, which is refined by providing a crosslinkage of a base resin, as will be discussed later, can be increased, by employing a negative-type resist. Further, the heating resistance of the crosslinking substance can be fully ensured. Thus, a deterioration of the crosslinking substance can be inhibited in an aggregation process of the metal fine particle 106 discussed later, thereby allowing to fix the metal fine particle 106 onto a target region with an improved accuracy.

Further, when a positive resist is employed, for example, "ZEP resist" (commercially available from Nippon Zeon Co., Ltd.), polymethyl methacrylate (PMMA) or the like may be utilized.

Further, the metal component may be dispersed as metal fine particles. Further, it is preferable to be dispersed in the resist composition as the metallic compound that is soluble to the solvent. This can provide uniformly dispersing the metal component in the resist composition. Further, a metallic compound of a form, which is soluble to the solvent of the resist material at least with a certain quantity, may also be utilized. Such type of the metallic compound may include, for example, metallocene, metal acetate, metal acetylacetonate, metallophthalocyanine and the like. For example, when a fine particle of Fe is to be adhered onto the substrate 101, a Fe chemical compound such as ferrocene, Fe acetate, Fe acetylacetonate, Fe phthalocyanine and the like may be employed.

Figure 3:
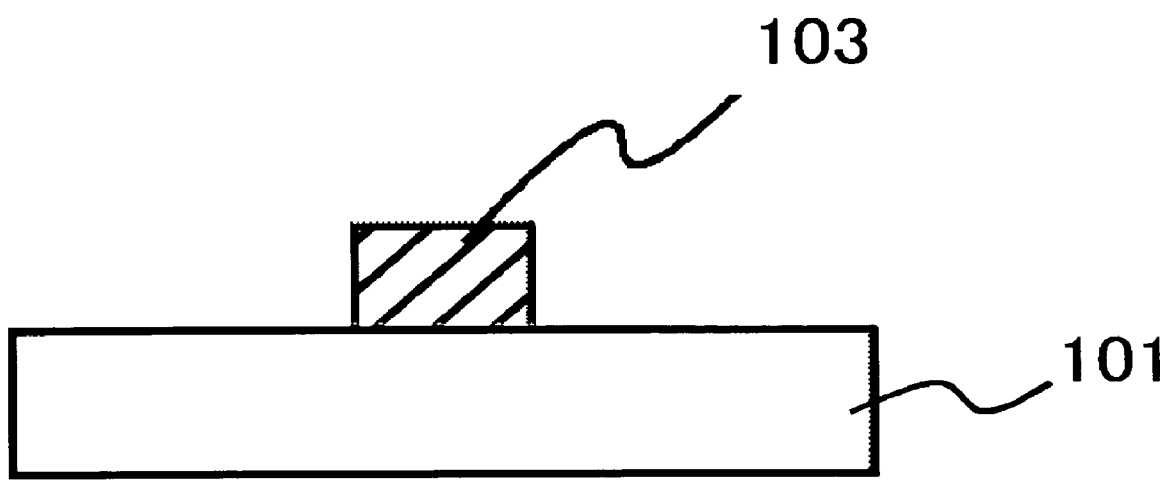
FIG. 3 is a cross-sectional view for describing a method for manufacturing the metal fine particle-adhered substrate according to the embodiment.

Cases of dispersing the metallic compound in the resist composition will be described as follows. Here, a case of dispersing the metal fine particles in the resist composition will be described in sixth embodiment. The resist film 102 is formed on the substrate 101, and then, the resist film 102 on the substrate 101 is patterned by a lithography. FIG. 3 is a cross-sectional view, which schematically shows a patterned resist 103 obtained by conducting an electron beam exposure for a negative-type resist.

Crosslinkage is created in the base resin included in the resist composition by the exposure, thereby increasing the molecular weight from several folds of the original value to an infinite level. The metal component exists in a matrix of the base resin, in a status of being uniformly dispersed and embedded therein. On conducting the development process, the base resin and the metallic compound of the unexposed portion are dissolved into a solvent to be removed from the substrate. On the other hand, concerning the exposed portion, the dissolution rate of the base resin is decreased as increasing the molecular weight thereof, thereby remaining on the substrate 101. The metal component embedded in the resist resin is also similarly remained.

In the above-mentioned procedure, the resist containing the metal component can be easily patterned only in the specified regions on the substrate that have been exposed. This technique can be applied to all organic metal species, which are soluble or dispersible to the solvent that is also contained in the resist material employed in the patterning process.

Further, a process for aggregating the metallic compound or a process for removing the base resin may be conducted over the resist film 102 or the patterned resist 103 including the metal component, according to applications of the metal contained in the added metal component.

Aggregation of the metal component existing as the metallic compound can be controlled by a thermal treatment process. The aggregation of the metal component in the patterned resist 103 is commenced at about 300 degree C., though it depends upon conditions such as the metal species, the concentration of the metal component, the constitution of the resist material, the mean molecular weight, geometry or the like. Consequently, after forming the resist film 102 and before conducting the removal of the resin component and the fixing of the metal fine particle 106, the substrate 101 having the patterned resist 103 formed thereon can be heated at a temperature of equal to or higher than 300 degree C., for example. The metal component can be surely aggregated by heating thereof at equal to or higher than 300 degree C. to obtain the fine particle 104. Further, the substrate 101 can be heated at a temperature of, for example, equal to or lower than 1,200 degree C. and preferably at a temperature of equal to or lower than 700 degree C. Having such configuration, a solid solution of the metal into carbon can be inhibited. Consequently, the metal and the carbon material can be exclusively aggregated. As a result, the fine particle 104 formed by aggregating the metal atoms in the patterned resist 103 and a resinified region 105 containing substantially no metal component are appeared (FIG. 4).

Figure 4:
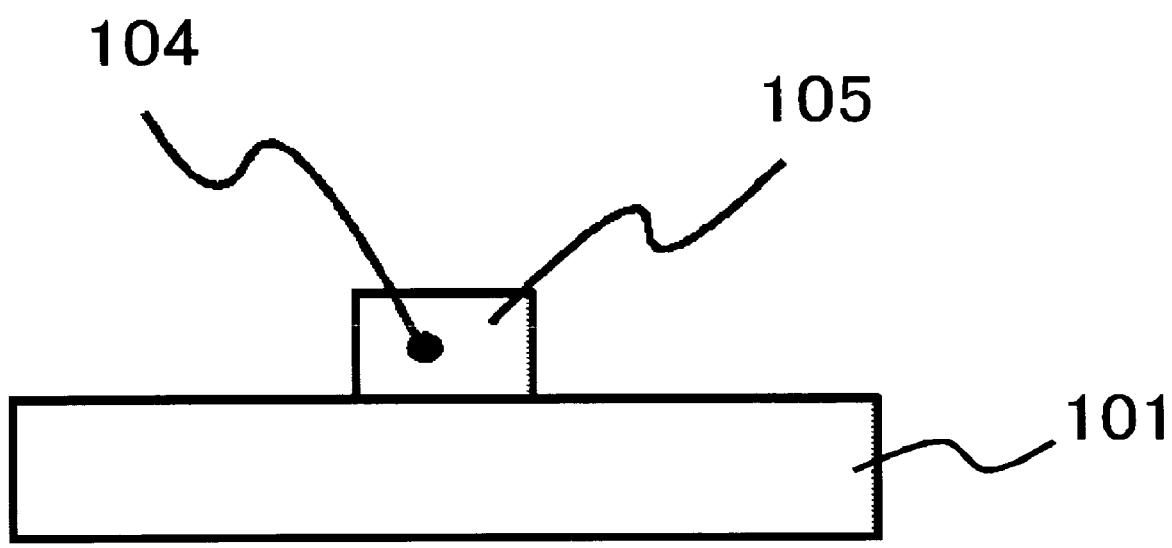
FIG. 4 is a cross-sectional view for describing a method for manufacturing the metal fine particle-adhered substrate according to the embodiment.

Here, the fine particle 104 in FIG. 4 is the fine particle of the metal corresponding to the metal fine particle 106 as described above in FIG. 1.

The size of the fine particle 104 can be controlled by the concentration of the metallic element in the resist composition, the thermal processing temperature and the thermal processing time. In order to obtain smaller particle size, it is preferable to reduce the concentration of the metallic element and to provide smaller patterned resist 103.

For example, the concentration of the additional metallic element added to the resist composition can be easily controlled to a level equal to or lower than one-1000th by weight over the resist material of the substance included in the resist solvent. For example, when the metallic element in the amount of one-1000th by weight of the amount of the resist material of the substance included in the resist solvent is added, only one metal fine particle having a size equal to or less than 1 nm in all four sides can be formed in the patterned resist, by manufacturing a dot pattern of the resist of about 10 nm in diameter and 10 nm in thickness and maintaining thereof at about 600 degree C. for about one hour within a vacuum.

Further, a particle of smaller size can also be obtained by selecting lower processing temperature or selecting shorter processing time. Conversely, when higher processing temperature or longer processing time is selected, the particle size is increased. When the processing temperature is further increased, the particle size is decreased due to a diffusion and an evaporation of the metallic element.

In the process for conducting the thermal treatment processing, atmospheric condition for conducting the processing is also critical. Since a hydrocarbon is normally selected for the main component of the resist material, it is combusted when a thermal treatment processing is conducted within an oxygen atmosphere. Accordingly, in order to prevent a combustion of the resist material, it is necessary to conduct the thermal treatment within an inert gas atmosphere or within a vacuum. In general, a patterned geometry of a pattern of a negative-type resist is maintained, even if a thermal treatment process is conducted at 800 degree C. under a degree of vacuum of equal to or lower than $10^{-4}$ Pa. On the other hand, oxygen can be intentionally introduced in the atmosphere to allow removing a resin in the patterned resist 103.

In the fine particle 104 resulted from the thermal processing, a portion is embedded within the patterned resist 103 in many cases, though it is existed in a condition of being exposed on the surface of the substrate 101. In the present embodiment, the resin in the patterned resist 103 is removed from such condition. In this process, the fine particle 104 moves toward the surface of the substrate 101, as the resin in the patterned resist 103 is removed. Consequently, the fine particle 104 can be adhered onto the surface of the substrate 101 as the metal fine particle 106, while removing the resin. In this way, the metal fine particle-adhered substrate is obtained (FIG. 1).

The removal of the resin in the case of employing a resist containing hydrocarbon-containing resin as a base resin can be achieved by exposing isotropic or anisotropic oxygen plasma, or by conducting a thermal treatment within an oxygen atmosphere at a temperature of 300 degree C. or higher and 1,200 degree C. or lower, and more specifically at a temperature of 400 degree C. or higher and 1,000 degree C. or lower. A portion of or all of the carbon resin can be removed by employing these methods without providing substantially no influence in a quantity of the metallic element contained in the metal fine particle 106. Further, the resin can also be removed by employing a plasma containing no oxygen, such as $N_2$ plasma, ammonia plasma and the like. In such case, it is preferable to apply a bias voltage. Having such procedure, the resin can be removed under a condition that the surface of the metal fine particle 106 is not oxidized.

Further, the metal fine particle 106 can be adhered thereon under a condition of being exposed on the surface of the substrate 101 by removing the resin from the patterned resist 103. Consequently, the metal fine particle 106 can be more effectively utilized as a catalyst. Further, an advantageous effect of fixing the size and the location of the metal fine particle 106 on the substrate 101 is exhibited.

In the present embodiment, the metal fine particle-adhered substrate is prepared by employing an operation for forming the resist film 102 that contains the resin component and the metal-containing particle, and an operation of removing the resin component from the resist film 102 and fixing the metal fine particle 106 consisting of the metallic element that composes the metal-containing particle onto the substrate 101. Consequently, one metal fine particle having a size equal to or less than 1 nm in all four sides can be surely fixed in the predetermined location on the substrate 101.

The metal fine particle-adhered substrate thus obtained can be employed as, for example, a catalyst for allowing a growth of a carbon nanotube on the substrate 101. Further, it can also be employed as a catalyst for allowing a growth of a semiconductor crystal rod. Further, it can also be employed as a mask for etching, an electronic reservoir of a single electron transistor, a dot of a quantum optical device or the like. A structure formed by allowing a growth of a carbon nanotube on the surface of the substrate 101 will be described in fourth and fifth embodiments. Further, a structure formed by allowing a growth of a semiconductor crystal rod will be described in eighth embodiment.

Second Embodiment

The present embodiment relates to another method for manufacturing the metal fine particle-adhered substrate shown in FIG. 1.

Figure 6:
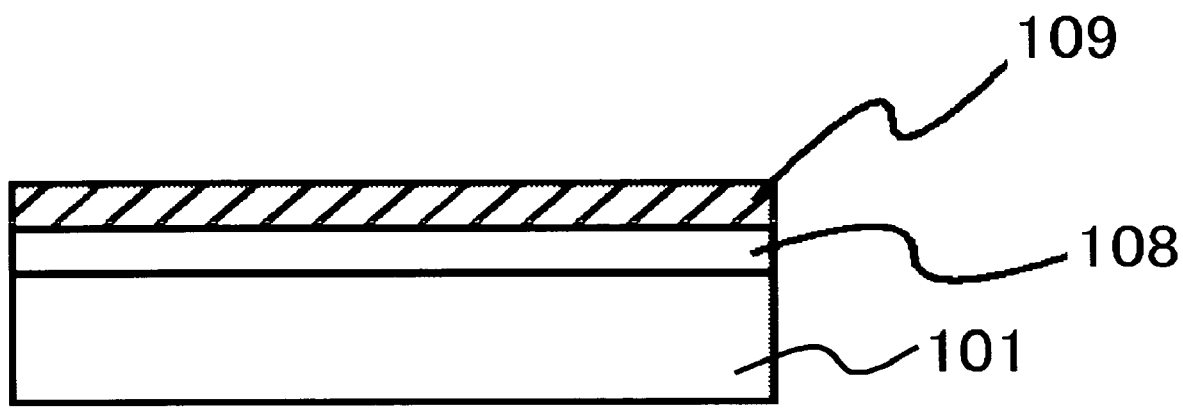
FIG. 6 is a cross-sectional view for describing a method for manufacturing the metal fine particle-adhered substrate according to the embodiment.

While a single layer of the resist film 102 is formed in the manufacture of the metal fine particle-adhered substrate described in first embodiment, a dual-layered resist film 102 may also be formed. FIG. 6 is a cross-sectional view, schematically showing a constitution having a dual-layered resist film formed thereon. In FIG. 6, a first film 108 and a second film 109 are formed in this sequence on a substrate 101.

First of all, the first film 108 is formed on the substrate 101. The first film 108 is a resist film that is free of metallic compound. The first film 108 is obtained by applying a resist composition and drying thereof via heating.

Subsequently, a solvent prepared by dispersing or dissolving a desired metallic compound is applied on the first film 108 via a spin coating to form the second film 109.

Here, the materials described in first embodiment, for example, may be employed for a base resin contained in the resist composition for forming the first film 108. Further, the solvent contained in the second film 109 may be preferably a poor solvent for the first film 108. For example, when ferrocene is contained as a metallic compound in the second film 109, acetone or alcohol may be employed. A thin film of ferrocene can be manufactured on first film 108 by dissolving about one % weight of ferrocene, for example, to these solvents and spin-coating a suitable amount of the solvent on the substrate 101.

In addition, the second film 109 may be a resist composition containing a metallic compound. For example, a film of the resist composition illustrated in first embodiment may be employed. This can provide adjusting the coating quantity of the metallic compound with an improved accuracy. Further, dissolving of the metallic compound into a liquid developer during the developing process can be inhibited. In such case, it is preferable to select the materials such as the base resins contained in the first film 108 and the second film 109 to be the same except the metal components.

When the resist film is exposed and the unexposed portion is dissolved into the liquid developer to remove thereof, it is possible that insoluble portions adhered to the substrate 101 are remained as residues, depending upon a surface state of the substrate 101, characteristics of the employed metallic compound such as a polarity, molecular weight and the like. In the present embodiment, the first film 108 containing no metal component is formed on the substrate 101, and the second film 109 containing a metal component is formed on first film 108. Consequently, it is configured that the metallic compound is not directly in contact with the substrate 101. Thus, a generation of a residue in the unexposed portion can be more surely inhibited.

The metal fine particle 106 can be disposed in the desired region with further improved accuracy, by conducting all processing after the patterning of resist over the substrate 101 having the dual-layered resist thus manufactured, employing the method described in first embodiment.

Third Embodiment

The present embodiment relates to yet other method for manufacturing the metal fine particle-adhered substrate.

Figure 13:
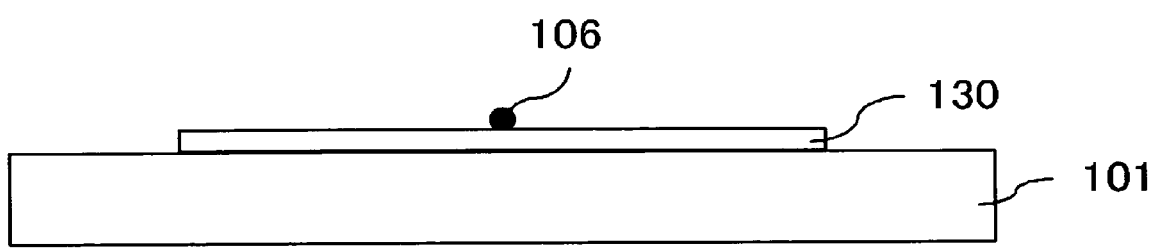
FIG. 13 is a cross-sectional view, schematically showing a configuration of a metal fine particle-adhered substrate according to an embodiment.

FIG. 13 is a cross-sectional view, schematically showing a constitution of a metal fine particle-adhered substrate according to the present embodiment. Basic constitution of the metal fine particle-adhered substrate shown in FIG. 13 is similar to the metal fine particle-adhered substrate shown in FIG. 1, except that a functional thin film 130 is provided on the substrate 101 so as to contact thereof, and the metal fine particle 106 is fixed on the functional thin film 130.

The functional thin film 130 is a diffusion barrier film for preventing from diffusing a metallic element contained in the metal fine particle 106 into the substrate 101. Further, it is the film for preventing from a surface diffusion of the metal fine particle 106 and for surely fixing thereof over the substrate 101.

The functional thin film 130 may be a film of a refractory metal having a melting point of, for example, equal to or higher than 2,000 degree C., or an alloy thereof. As for refractory metal, for example, tantalum (Ta), tungsten (W), molybdenum (Mo), rhenium (Re), osmium (Os), ruthenium (Ru), iridium (Ir) or the like may be employed.

Further, the functional thin film 130 may be a film of a ceramic containing a metallic element of, for example periodic table group 4, periodic table group 5, periodic table group 6, periodic table group 13, periodic table group 14 or the like. The ceramic film may be, for example, an oxide film, a nitride film or an oxynitride film of a metal or two or more metals selected from the group consisting of aluminum (Al), tungsten (W), molybdenum (Mo), tantalum (Ta), titanium (Ti), silicon (Si), zirconium (Zr) and hafnium (Hf). Typical oxide film may be, for example, $SiO_2$. Typical nitride film may be, for example, SiN, TaN or the like. Further, typical oxynitride film may be, for example, SiON film.

The thickness of the functional thin film 130 may be, for example, 0.1 nm or more and 5 nm or less. Having such value, the chemical condition and the structural condition of the surface of the substrate 101 can be surely changed, and the metal fine particle 106 can be surely fixed onto the substrate 101. Further, as for the thickness of the functional thin film 130, a minimum thickness required for providing changes in the chemical condition and the structural condition of the surface of the substrate 101 may be selected, and therefore the thickness of the functional thin film 130 may be, for example, equal to or smaller than 1 nm. Sufficient functions can be presented even though the thickness is equal to or smaller than 1 nm.

Figure 11:
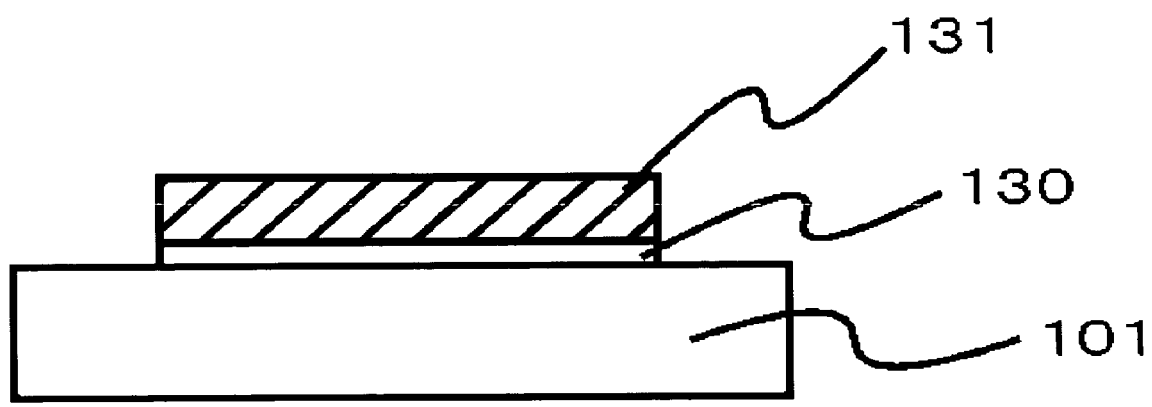
FIG. 11 is a cross-sectional view for describing a method for manufacturing a metal fine particle-adhered substrate according to an embodiment.

FIG. 11 is a cross-sectional view for describing a method for manufacturing the metal fine particle-adhered substrate shown in FIG. 13. As shown in FIG. 11, first of all, a functional thin film 130 and a resist film 131 is deposited on a substrate 101 in this sequence.

The functional thin film 130 may be formed via a thermal deposition process or a sputter deposition process. Alternatively, when a ceramic film is employed for the functional thin film 130, the film may be prepared by oxidizing or nitriding the surface or the whole of the substrate 101 after depositing a metal.

The resist film 131 may be, for example, the resist film 102 described in first embodiment. Alternatively, the multi-layered film of the first film 108 and the second film 109 described in second embodiment may also be employed. Processes described in first or second embodiment, for example, may be employed for manufacturing the resist film 131.

In the present embodiment, the metal fine particle 106 is fixed onto the functional thin film 130 on the substrate 101. A diffusion of the metallic element into the substrate 101 occurred in the process for manufacturing the metal fine particle-adhered substrate may be inhibited by providing the functional thin film 130. As a result, thorough control in the quantity of the metallic element can be achieved through the operation for manufacturing the metal fine particle. In addition, when the metal fine particle-adhered substrate is applied to electronic devices, a generation of a leakage electric current leaked out through the metallic element diffused into the substrate 101 to the substrate can be inhibited.

Further, the metal fine particle 106 can be surely fixed onto the substrate 101 in the operation for manufacturing the metal fine particle and the applied operation thereof conducted later, and in particular in the operation for conducting a heating, by disposing the functional thin film 130 existing therein. In general, the melting point of the metal fine particle 106 is decreased due to a size effect. Consequently, the metal fine particle 106 melts at a temperature of equal to or lower than the melting point of the bulk thereof, thereby allowing thereof to easily move on the substrate 101. In the present embodiment, a affinity between the surface material of the functional thin film 130 and the material of the metal fine particle 106 can be controlled to provide an improved affinity or on the contrary to provided deteriorated affinity, by selecting the material of the functional thin film 130. Consequently, the fixing strength onto the substrate 101 can be optimized.

In addition, a surface morphology can be changed by providing the functional thin film 130, thereby optimizing the fixing strength onto the substrate. In particular, when the film thickness is equal to or smaller than 5 nm, the functional thin film 130 is allowed to form a structure having fine roughness on the surface thereof. Such fine structure can provide stronger fixing nature of the metal fine particle 106. Consequently, the metal fine particle 106 can be surely sustained at a single predetermined point on the substrate 101, even in higher temperature.

The metal fine particle-adhered substrate according to the present embodiment can be preferably employed as a substrate having a catalyst of the carbon nanotube adhered thereon, when the carbon nanotube-containing substrate discussed later, for example, is to be manufactured. In addition, it can also be employed as a substrate having a catalyst for the semiconductor crystal rod adhered thereon, when the semiconductor crystal rod as discussed later is to grow. Further, it can also be employed as a mask for etching, an electronic reservoir of a single electron transistor, a dot of a quantum optical device or the like.

Fourth Embodiment

Figure 5:
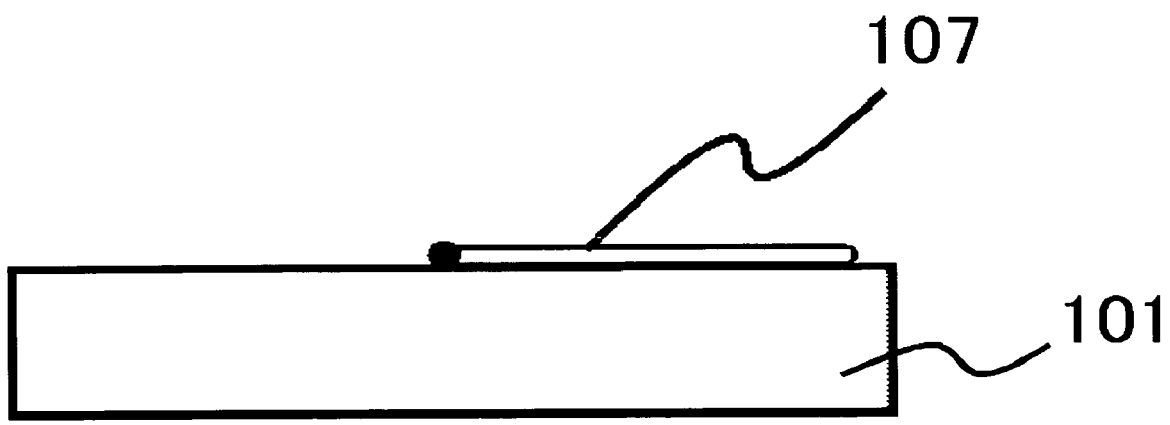
FIG. 5 is a cross-sectional view, schematically showing an exemplary manufacture of a carbon nanotube utilizing the metal fine particles of FIG. 1 as a catalyst.

The present embodiment relates to a carbon nanotube-containing substrate that employs the metal fine particle-adhered substrate described in first to third embodiments or other embodiments discussed later. FIG. 5 is a diagram, schematically showing a carbon nanotube-containing substrate of the present embodiment. In FIG. 5, a condition that a carbon nanotube is formed along a surface of a substrate 101 from a metal fine particle 106 adhered onto the substrate 101 as a basic point. The metal fine particle 106 is a catalyst for allowing a growth of a carbon nanotube 107.

A structure of FIG. 5 can be manufactured as follows. First, a metal fine particle-adhered substrate is manufactured by utilizing the methods described in first to third embodiments or other embodiments discussed later. A case of utilizing the metal fine particle-adhered substrate described in first embodiment (FIG. 1 to FIG. 4) will be described as follows. In this case, a patterned resist 103 containing a fine particle 104 on the substrate 101 is manufactured by a method stated above (FIG. 4).

It is preferable to employ a material, which exhibits no change in chemical composition, geometry and state and no catalytic activity for allowing the growth of the carbon nanotube 107 at a temperature for allowing the growth of the carbon nanotube 107, as the material employing for the substrate 101. More specifically, such materials may include Si, silicon oxide, silicon nitride, oxynitride silicon, silicon carbide, aluminum oxide, refractory metals, transition metal compounds and the like. In addition, a silicon substrate having an oxide film formed on the surface thereof may be employed for the substrate 101.

A resist composition employed for forming the resist film 102 contains a metal component having a catalytic activity for allowing the growth of the carbon nanotube 107. The resist described in first embodiment, for example, may be employed for the resist. Among these, a negative-type resist for an electron beam lithography is preferably employed. For example, calix arene-containing resist, polystyrene-containing resist, polymethacrylate-containing resist, silsesquioxane-containing resist or the like may be utilized.

The metal having the catalytic activity for allowing the growth of the carbon nanotube 107 may include, for example, iron, nickel, cobalt and the like. In order to disperse the catalyst metals in the resist film, a metallic compound of a form, which is soluble to the solvent of the resist material at least with a certain quantity, may be utilized. Any of these elements mentioned above can stably exist as metallocene or phthalocyanine compound, and are soluble to resist solvents such as chlorobenzene, anisole, ethyl lactate, ethers and the like, and to other organic solvents such as ketones, alcohols and the like.

Here, in order to employ the metal fine particle 106 as the catalyst for allowing the growth of the carbon nanotube 107, it is necessary to have the surface of the metal fine particle 106 being exposed. Consequently, in order to further enhance the activity of the fine particle catalyst, it is effective to eliminate the materials covering the surface, which have no catalytic activity. Typical materials having no catalytic activity include a component such as the base resin contained in the patterned resist 103.

Since the substrate 101 is generally heated up to a temperature of, for example, around 800 degree C. in a vapor phase deposition process for the carbon nanotube 107, variations such as proceeding further aggregation and the like are occurred in a metal fine particle 106, which is formed by processing at a temperature equal to or less than the above-described heating temperature. Nevertheless, the resin in patterned resist 103 is removed to leave only the metal fine particle 106 that will function as a catalyst in a condition of being isolated on the substrate 101, such that a variation in the geometry of the metal fine particle 106 due to the heating process can be suppressed to a minimum level. In addition, the thermal processing at the temperature that is higher than the temperature for conducting the vapor phase deposition of the carbon nanotube 107 is previously conducted, such that unwanted variation in the geometry of the metal fine particle 106 in the operation for allowing the growth of the carbon nanotube 107 can be suppressed.

Typical processes for cleaning the surface of the metal fine particle 106 include, for example, the plasma processing or the thermal treatment processing described in first embodiment.

Once the metal fine particle-adhered substrate (FIG. 1) is obtained, the carbon nanotube 107 is allowed to grow by a vapor phase deposition process. The vapor phase deposition of the carbon nanotube 107 may be conducted at a temperature of, for example, 600 degree C. or higher and 800 degree C. or lower, within thermally decomposed methane gas flow. Alternatively, deposition can also be conducted by at the similar temperature by employing, for example, alcohols such as ethanol, methanol and the like, acetylene gas or the like. Further, an inert gas such as argon gas, nitrogen gas and the like may be mixed into a source gas for diluting the source gas. Alternatively, hydrogen gas or water vapor may be mixed into the source gas for reducing the catalyst metal. Alternatively, oxygen gas or water vapor may be mixed into the source gas for removing unwanted amorphous carbon. The deposition of the carbon nanotube can be promoted by mixing these gases in the source gas.

The carbon nanotube 107 grows along a surface of a substrate 101 from a metal fine particle 106 as a basic point, for example (FIG. 5). Further, a multiple-layered or a monolayered carbon nanotube may be allowed to grow. The outer diameter of the obtained carbon nanotube is substantially equal to the particle diameter of the metal fine particle 106. Consequently, the diameter of the carbon nanotube can be simply and stably controlled by controlling the size of the metal fine particle 106 to be fixed on thee substrate 101. Further, the monolayered carbon nanotube can be obtained with an improved efficiency by selecting the diameter of the metal fine particle as about 2 nm or smaller.

Fifth Embodiment

The present embodiment relates to another procedure for preparing the carbon nanotube-containing substrate.

A fine particle 104 exists in the patterned resist 103 prepared in the course of the processes for manufacturing the metal fine particle-adhered substrate described in first to third embodiments or other embodiments discussed later, as described above by employing FIG. 4. This fine particle 104 moves the inside of the matrix of amorphous carbon by excitation of the heat, in the heated condition. In such course, the fine particle 104 forms a tube-like or sheet-like graphite phase in a region that is to be a locus thereof by a catalytic effect thereof.

As a result, the patterned resist 103, which has been originally in an amorphous condition, generally transforms to a graphite phase, as the thermal treatment process is progressed. The graphite pattern can be formed on the substrate by utilizing such effect. Typical metallic element that promotes the effect described above includes, for example, an element that is to be a catalyst for allowing the growth of the carbon nanotube. More specifically, for example, Fe, Ni, Co or the like may be included.

The metal fine particle-adhered substrate employed for forming the graphite pattern may be obtained by, for example, manufacturing the metal fine particle 106 shown in FIG. 1 via the processes for manufacturing the metal fine particle-adhered substrate described in first to third embodiments or other embodiments discussed later.

Further, random and a plurality of fine particles may be manufactured by a method for patterning a metal thin film via lifting off or milling and then thermally treating thereof, or by a method for applying a solvent containing metal-containing particles. In this case, a similar graphite pattern can be formed by forming a patterned resist using the usual resist that contains no metal-containing particle and then conducting a thermal treatment process, after the fine particles are manufactured.

While the patterned resist 103 before heating is a carbon resin having lower thermal conductivity and lower electrical conductivity, the graphite phase exhibiting better electrical conductivity and thermal conductivity is formed by the heating process. Having such procedure, the obtained graphite pattern can be utilized as, for example an interconnect material for higher performance application or a heat-waste material.

When the graphite pattern formed on the surface of the substrate 101 is employed as an interconnect material, catalyst metal such as Fe and the like is dispersed in the resist material in a form of a chemical compound or fine particles. Then, a resist material is applied on the substrate 101 via such as a spin coating process to form the resist film 102 (FIG. 2). Further, the patterned resist 103 is formed in a desired region for forming an interconnect via an exposure to electron beam, exposure to light and the like (FIG. 3). Then, graphitization of the whole patterned resist 103 can be achieved by conducting a thermal treatment process via, for example, the thermal processing process described in first embodiment to a level that a graphitization effect by the catalyst metal is generated.

Here, the heating temperature can be suitably selected in accordance with a type of the metallic element and/or a type of the resin in the patterned resist 103. More specifically, for example, the temperature may be equal to or higher than 500 degree C. Further, it is preferable to employ the temperature of 700 degree C. or higher and 800 degree C. or lower. Having such condition, the fine particle 104 (FIG. 4) can be surely transferred.

Further, the heating temperature can be reduced to a lower level by employing a mixture of the catalyst metals such as iron, nickel, cobalt and the like, or by employing a mixture of different metals having a property of being solid soluble with the aforementioned catalyst. For example, the heating temperature may be reduced to a level of equal to or lower than 450 degree C. This can conform the process condition thereof to that for manufacturing the silicon devices.

Further, when the graphite pattern is employed as the thermal conduction film, the graphitization thereof can be achieved in a similar way by mixing the resist material with fine particles or a chemical compound of the metal that is to be a catalyst, forming a film thereof on the substrate 101 via the spin coating process, and then conducting a thermal treatment process. When a resist composition having a possibility for causing a decomposition or an evaporation in the heating process is employed, it may be better forming crosslinkages in a base resin by an exposure to electron beam or an exposure to light, or selecting a resist composition containing a base resin having larger molecular weight.

In addition, the metal fine particle 106 shown in FIG. 1 may be manufactured via the processes for manufacturing the metal fine particle-adhered substrate described in first to third embodiments or other embodiments discussed later, or random and a plurality of fine particles may be manufactured via the above-described process, and then amorphous carbon resin may be disposed so as to cover this metal fine particle. For example, a line-shaped pattern having a width and height of, for example, equal to or smaller than 20 nm may be manufactured on the metal fine particle employing the ordinary resist that contains no metal-containing particle. Then, the substrate having the pattern formed thereon may be heated to transfer the metal fine particle within the resist, thereby allowing to dispose a line-shaped long graphite tube at a predetermined position on the substrate in a region where said metal particle is transferred to form a locus. The graphite tube may be applied to the manufacture of an electronic device or a sensor, for example.

Further, the remaining amorphous carbon, which is not graphitized in the thermal treatment process, can be removed by exposing thereof to an oxygen plasma or high-temperature oxygen atmosphere, as the fact that amorphous carbon is more easy to be oxidized than graphite is utilized.

Sixth Embodiment

Figure 7:
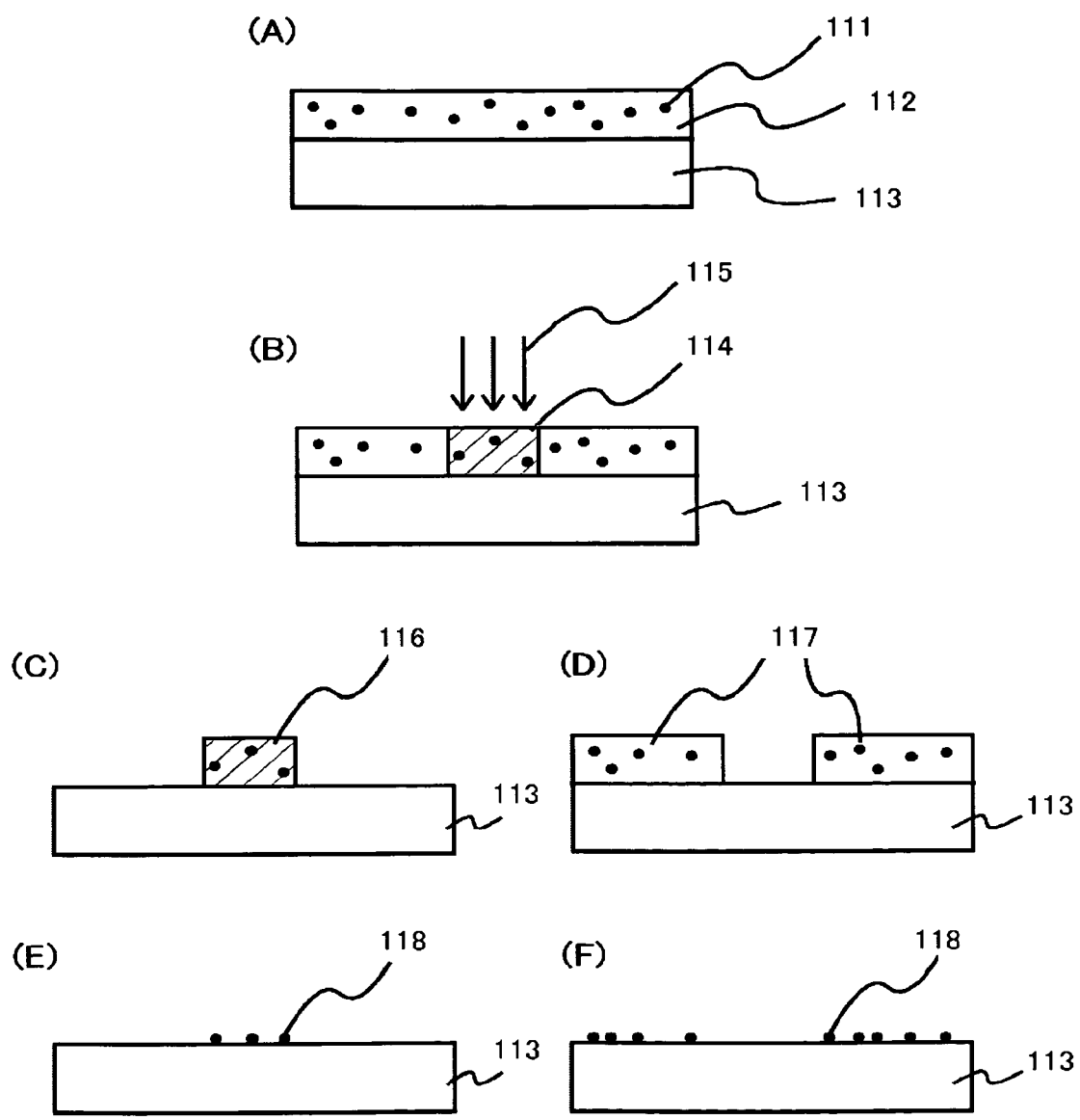
FIG. 7 is a cross-sectional view for describing a production process for manufacturing the metal fine particle-adhered substrate according to the present embodiment.

The present embodiment relates to another method for manufacturing the metal fine particle-adhered substrate. While dispersion in the resist film 102 is achieved in a form of the metallic compound in the above-mentioned embodiments, the present embodiment involves dispersing the metal fine particle directly in the resist composition. FIG. 7 is a cross-sectional view for describing a method for manufacturing a metal fine particle-adhered substrate according to the present embodiment.

First of all, a resist film 112 containing metal fine particles 111 dispersed therein is manufactured on a substrate 113 (FIG. 7A). The materials for the substrate 113 is not particularly limited, and for example, the materials illustrated in the above-mentioned embodiments may be employed. Also, metal fine particles, which are previously prepared by a liquid phase process or a gas phase process, may also be employed.

The resist film 112 may be formed by, for example, a process, in which a powder or a dispersion liquid of the metal fine particles 111 is directly added into the resist composition, and the obtained composition is applied on the substrate 113 by a process such as spin coating and the like. In this case, in order to prevent adherences among the metal fine particles 111, it is preferable to employ fine particles having a molecular film of an organic compound such as a surfactant and the like on the surface thereof. Having such constitution, a dispersing stability of the metal fine particles 111 can be improved.

The resist film 112 may also be a dual-layered resist described in second embodiment. In such case, the resist may also be formed by depositing a resist film containing no metal fine particle 111 on the surface of the substrate 101, and applying a dispersion liquid of the metal fine particles on the film via a spin coating process or the like. In this case, in order to prevent elimination of the fine particles in the developing process, it is effective to conduct processing for forming a cap film for the resist or for heating thereof at a temperature of equal to or higher than a glass-transition temperature of the resist material to embed the fine particles within the film or the like, as required. Such process is suitable in the case of employing the metal fine particle 111 dispersed in an aqueous solvent.

Further, as described above in third embodiment, the functional thin film 130 may be provided on the substrate 101, and the resist film 131 may be provided on the functional thin film 130 as a resist film 112 according to the present embodiment (FIG. 13).

Next, particle beam 115 such as electron, photon, atom (ion) is irradiated in the target region 114 (FIG. 7B). Thereafter, the developing process for the resist film 112 and the drying process are conducted. In this way, the patterned resist containing the metal fine particles 111 dispersed therein is obtained. FIG. 7C is a diagram, showing a patterned resist 116 in a case of employing a negative-type resist material. FIG. 7D is a diagram, showing a patterned resist 117 in a case of employing a positive resist material. When the positive type is employed, the patterned resist 117 is formed in regions except the region 114 that is irradiated with particle beam 115.

Further, an oxygen plasma processing or a high-temperature annealing in an oxygen atmosphere may be conducted by employing the method described in first embodiment to eliminate the resin contained in the patterned resist 116 or the patterned resist 117 or to remove a portion of an organic molecular film on the surface of the metal fine particle 111. In this way, the metal fine particle 118 can be adhered in a predetermined location on the metal fine particle 111 (FIG. 7E, FIG. 7F).

The metal fine particle-adhered substrate of the present embodiment may be employed as a catalyst for allowing the growth of the carbon nanotube or for allowing the growth of a semiconductor crystal rod, similarly as in the above-mentioned embodiments. For example, the metal fine particle-adhered substrate of the present embodiment may be utilized for preparing the carbon nanotube-containing substrate described in fourth or fifth embodiment. In addition, Semiconductor crystal rod-containing substrate will be described in eighth embodiment. Further, it can also be employed as a mask for etching, an electronic reservoir of a single electron transistor, a dot of a quantum optical device or the like.

Seventh Embodiment

In the present embodiment, patterning of the metal particle onto the substrate is conducted by a chemical vapor deposition (CVD) employing a focused ion beam (FIB). This technique is a method, in which a source material that has been vaporized is sprayed onto the surface of the substrate, and ion beam is simultaneously irradiated, thereby decomposing mainly the source material adhered on the surface of the substrate to locally deposit thereof. Descriptions will be made as follows, in reference to the case that the metal particle is a catalyst for allowing a growth of a carbon nanotube.

In order to introduce a catalyst metal for conducting a vapor phase deposition of a carbon nanotube into a deposit, various metallic compounds may be mixed into a source gas. The source gas may be an organic molecular gas containing organometallic molecules. Typical material suitable for a source material of FIB-CVD is that the material is in a solid state at the room temperature and has a vapor pressure of equal to or higher than $10^{-5}$ Pa by heating to around 100 degree C. This is because a material, which is capable of being gasified and has a higher adsorption coefficient to the solid surface, is suitable for the FIB-CVD. More specifically, organometallic compounds of relatively lower molecular weight, such as metallocene compounds or carbonyl compounds containing Fe, Ni, Co and the like may be preferred.

Figure 8:
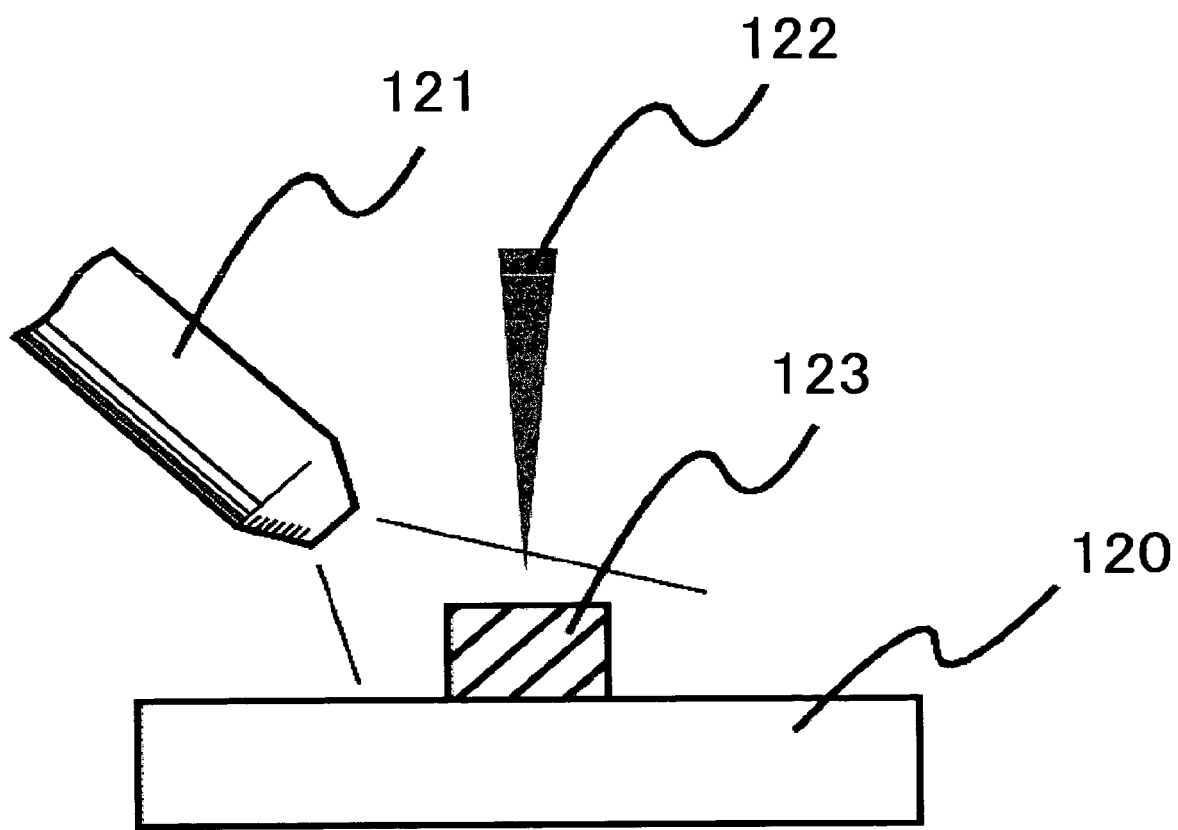
FIG. 8 is a cross-sectional view for describing a method for manufacturing the metal fine particle-adhered substrate according to the embodiment.

This method will be described as follows in reference to FIG. 8 and FIG. 9, by illustrating a case of employing ferrocene, which is iron metallocene, as an employed metallic compound. First, a substrate 120 is disposed within a sample holder in a vacuum apparatus that is capable of irradiating a focused ion beam 121. Materials similar as the materials employed for the substrate 101 in the above-mentioned embodiments may be employed for the material of the substrate 120. For example, in the case of employing thereof for allowing the growth of the carbon nanotube, an Si substrate having an oxide film may be employed.

Solid ferrocene is heated to 65 degree C., and a vaporized gas thereof is sprayed directly on a surface of a substrate 120 through a nozzle 122, and Ga$^+$ focused ion beam 121 of 30 keV accelerating voltage is irradiated over the same region. A partial pressure of ferrocene gas in the vacuum apparatus is about $10^{-3}$ Pa. In addition, suitable amount of ionic current for irradiation is 0.1 to 100 pA. For example, when ion beam of 1 pA is irradiated over the substrate in a ferrocene gas atmosphere for 30 seconds, a column-shaped deposit 123 having a diameter of 100 nm and a height of 1.5 µm is formed. The deposit 123 is formed so as to cover the region where the metal fine particles 124 is to be fixed.

The deposit 123 is a decomposed product of ferrocene, and has a structure containing iron atoms substantially uniformly dispersed in the amorphous carbon. Content of iron is around 10% by a composition ratio. It is a critical characteristic of iron atom that iron atom produces no fine particle, and as a result, the formation of the fine particle due to a thermal stimulus can be controlled.

In addition, in order to control the iron content, another receptacle for source material may be prepared, and aromatic hydrocarbon molecules containing no metal such as phenanthrene, pyrene and the like may be supplied simultaneously with or separately from supplying of a catalyst element-containing source material, thereby allowing to control a metal content in the deposit 123.

Iron atoms in the deposit 123 manufactured by the FIB-CVD can be aggregated similarly as in first embodiment, by, for example, conducting a thermal processing that involves heating to a temperature of 300 degree C. or higher and 1,200 degree C. or lower within an inert gas atmosphere or within a vacuum. Concerning the structure manufactured from the ferrocene source material, iron fine particles of about 10 nm are precipitated by conducting a thermal treatment at 600 degree C., and the particle size is increased as increasing the processing temperature. In addition, a carbon portion removal process such as an oxygen plasma processing and the like may be conducted. In addition, the pattern is heated to a temperature of 300 degree C. or higher and 1,200 degree C. or lower within an oxygen atmosphere to remove organic constituents in the deposit 123 and to fix the metal fine particles 124 in the predetermined locations on the substrate 120.

In addition, although the structure of the deposit 123 manufactured by the FIB-CVD is contaminated with Ga, which is an ion source, when Ga is thermally treated within a vacuum, a precipitation on the surface thereof is commenced from around 400 degree C., and most of these are evaporated by conducting a thermal processing at a temperature of 500 degree C. or higher and 600 degree C. or lower for around one hour. This allows eliminating Ga.

The metal fine particle-adhered substrate of the present embodiment may be employed as a catalyst for allowing the growth of the carbon nanotube or for allowing the growth of a semiconductor crystal rod, similarly as in the above-mentioned embodiments. For example, the metal fine particle-adhered substrate of the present embodiment may be utilized for preparing the carbon nanotube-containing substrate described in fourth or fifth embodiment. In addition, Semiconductor crystal rod-containing substrate will be described in eighth embodiment. Further, it can also be employed as a mask for etching, an electronic reservoir of a single electron transistor, a dot of a quantum optical device or the like.

Figure 9:
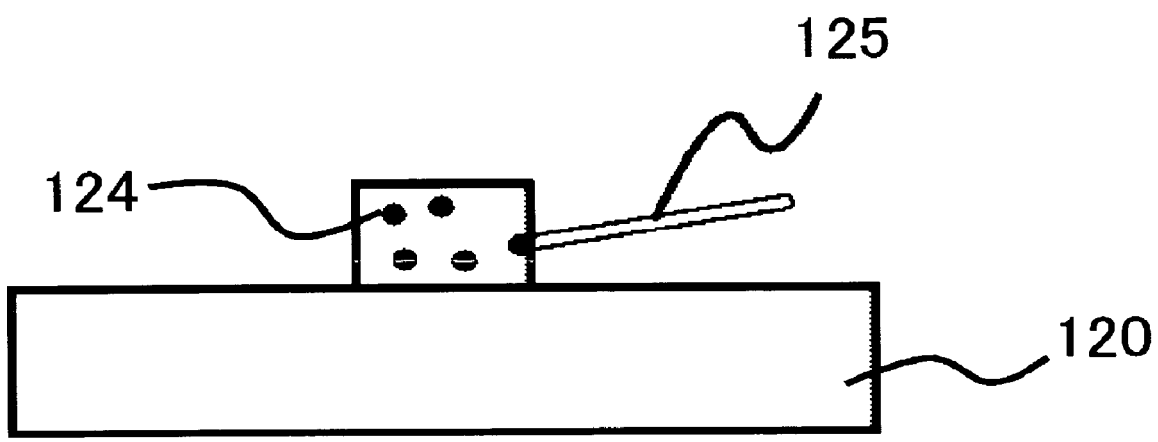
FIG. 9 is a cross-sectional view, schematically showing a condition that a carbon nanotube grows from a metal fine particle in the deposit shown in FIG. 8 as a basic point.

For example, FIG. 9 is a cross-sectional view, schematically illustrating a condition of a carbon nanotube 125 growing from a basic point of a metal fine particle 124 formed by heating the deposit 123 to aggregate thereof. While FIG. 9 shows a condition, in which the carbon nanotube 125 is allowed to grow without removing the carbon component in the deposit 123, the metal fine particle 124 moves toward the surface of the substrate 120 by removing the carbon component in the deposit 123, eventually fixing and adhering thereof onto the surface of the substrate 120. Hereafter, the carbon nanotube 125 may also be allowed to grow.

Eighth Embodiment

The present embodiment relates to a method for allowing a growth of a crystalline rod of a semiconductor that employs the metal fine particle-adhered substrate obtained by the above-described embodiments.

One of the semiconductor epitaxial growing processes is a method for employing an Au fine particle being disposed on the substrate and having a particle diameter of about several nm to about several hundred nm as a catalyst, and for allowing a growth of a crystalline rod having a diameter that corresponds to the particle diameter. In this method, controllability in the size and the arrangement of the Au fine particle are critical. In the present embodiment, Au fine particle is let to adhere on substrate by using method described in the above-mentioned embodiment. The method provides a manufacture of the crystalline rod of a semiconductor such as Si, InP and the like, by allowing the growth of the crystalline rod of the semiconductor by vapor deposition process, employing the Au fine particle as a catalyst.

For example, a proper amount of a solvent containing 1% wt. of methylacetoxy calixarene and 0.5% wt. of gold carbonyl or a gold compound that is soluble in an organic solvent such as dimethylgold acetonate, dissolved in a monochlorobenzene solvent, is dropped onto the silicon oxide substrate, and a spin coating process is conducted at 3,000 revolutions per minute (rpm). Thereafter, it is heated to a temperature of 120 degree C. within a dry nitrogen atmosphere and maintained for one hour to carry out the drying of the solvent.

An electron beam irradiation is conducted over the obtained substrate having the resist with an electron beam exposure machine at a reasonable amount (for example, 10 $mC/cm^2$ or more and 100 $mC/cm^2$ or less). Thereafter, the substrate is immersed within xylene for 30 seconds to achieve the development process. Then, this is dried to obtain a resist having an arbitrary pattern. When calix arene, for example, is employed as a resist, a patterned resist including gold is formed in the portion where the electron beam irradiation is made, because it is the negative-type resist. Thus, in this case, it is sufficient to conduct the electron beam irradiation only over the portion where the Au fine particles are desirable to be disposed.

Next, a thermal treatment process is conducted at a temperature of around 300 degree C. to 600 degree C. for around 5 minutes to 1 hour, while the substrate is maintained within an atmosphere of, for example, a vacuum level of equal to or lower than $10^{-4}$ Pa. The thermal treatment process provides aggregating the Au fine particles in the patterned resist. The size and the quantity of the created Au fine particles depends upon the concentration of gold in the patterned resist, the size of the pattern and the temperature for the thermal treatment process. When the temperature for the heating treatment process is sufficiently high, it is possible to manufacture one fine particle per one patterned resist, by reducing the concentration of gold or employing a pattern having a dot of a smaller size. On the other hand, when the concentration is increased or the larger size of the pattern is employed, a plurality of fine particles are created per one pattern.

Next, in order to remove the carbon resin portion in the patterned resist, an oxygen plasma processing or an oxygen atmosphere annealing is conducted. Having this processing, materials obstructing the catalytic activity of the gold surface can be surely removed. The above-described processing provides the oxidization of the carbon resin portion, which is, in turn, eliminated into a gas phase, only portions of the Au fine particles can be remained on the substrate.

As a result of the present inventors' investigation, gold fine particles having a mean diameter of 20 nm were able to be manufactured from an Au containing patterned resist having a pattern size of 80×80 $nm^2$ and a height of 40 nm, which was manufactured by irradiating an electron beam at an exposure of 80 $mC/cm^2$.

This substrate with the Au fine particles is heated at a temperature around 500 degree C. within a glass tubes, in which a vacuum of equal to or lower than 1 Torr is created, and a process for allowing a growth of a silicon rod is conducted with a thermal decomposition-silane gas flow diluted to 10% with helium. As a result of the present inventors' investigation, it was confirmed that a rod crystal having a size that is almost the same size of catalyst was allowed to grow by the above-mentioned process, utilizing the Au fine particles as the catalyst.

In addition, the length of the crystalline silicon rod was able to be controlled by adjusting the growing time, the growing temperature or the flow rate of the supply gas.

In addition, trimethylgallium and trimethylindium as IIIB-source and arsin and phosphine as VB-source can be employed as a source gas for allowing the growth of a compound semiconductor. By employing the combination of these gases, a crystal growth of GaAs, GaP, InAs, InP or the like is possible. In addition, a source material can also be supplied from a solid source material of these semiconductors through a gas flow of hydrogen.

Ninth Embodiment

In the present embodiment, the semiconductor crystalline rod-containing substrate obtained in the above-mentioned embodiment is applied to a transistor. FIG. 12A to FIG. 12D are cross-sectional views for describing a process for manufacturing a transistor according to the present embodiment.

Figure 12:
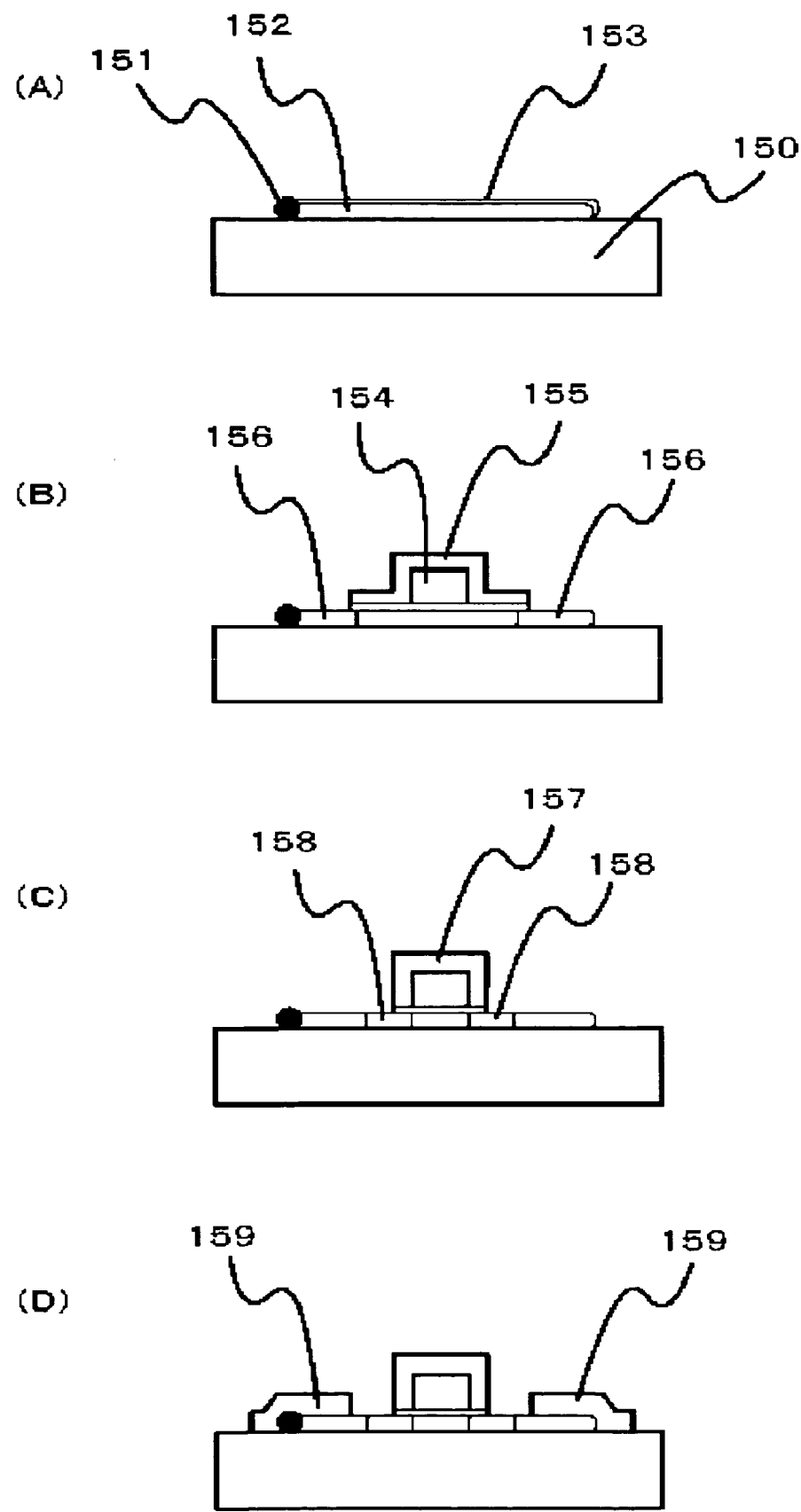
FIG. 12 is a cross-sectional view for describing a method for manufacturing a transistor according to an embodiment.

In FIG. 12A, a gold fine particle 151 having a diameter of about 20 nm is manufactured at a desired position on an insulating substrate 150, by the methods described in first to third, sixth and eighth embodiments, and further, a crystalline silicon rod 152 is manufactured by the method described in eighth embodiment. Further, an oxide film 153, which is a surface oxide film, is provided on the surface of the crystalline silicon rod 152. The oxide film 153 is formed by oxidizing the surface of the crystalline silicon rod 152 by employing an oxygen containing gas such as oxygen, water vapor, ozone, oxygen plasma and the like at a lower temperature of, for example, around 350 degree C.

When the crystalline silicon rod is allowed to grow by employing the catalyst of the gold fine particle 151 as an origin, a mechanical force for pushing down, a pressure by flow of a fluid, an electrostatic force, or a light pressure can be given to the crystalline silicon rod during the growing process or after the growing process, in order to align the crystalline silicon rods along a certain direction.

Next, a high concentration-polysilicon film is formed on the entire surface of the insulating substrate 150 by a CVD process, and a gate electrode 154 shown in FIG. 12B is formed by a lithographic operation including a resist patterning, dry etching and the like. Further, a silicon nitride film 155 is formed as a silicon nitride film mask by the similar lithographic operation for forming the source/drain, and exposed portions of the oxide film 153 are removed. A source-drain region 156 is formed through a mask of the silicon nitride film 155 via, for example, an ion implantation process or a thermal diffusion process.

Thereafter, in order to form the source-drain region 156, the silicon nitride film 155 is removed, and the silicon nitride film 157 is manufactured via a process similar to that employed for the silicon nitride film 155 again. The exposed portions of the oxide film 153 are removed through a mask of the silicon nitride film 157, and a source-drain region 158 of shallow implantation depth is formed at a lower concentration than that for the source-drain region 156 (FIG. 12C).

Eventually, as shown in FIG. 12D, an electrode 159 is manufactured so as to cover the source-drain region 156, thereby manufacturing the transistor according to the present embodiment.

According to the above-mentioned method, sure connoting between the source and the drain of the transistor can be presented via the semiconductor-crystalline rods. Consequently, the transistor exhibiting better manufacturing stability can be stably obtained with higher production yield.

Tenth Embodiment

In the present embodiment, the carbon nanotube-containing substrate obtained by the methods described in the above-mentioned embodiments is applied to a transistor.

Figure 10:
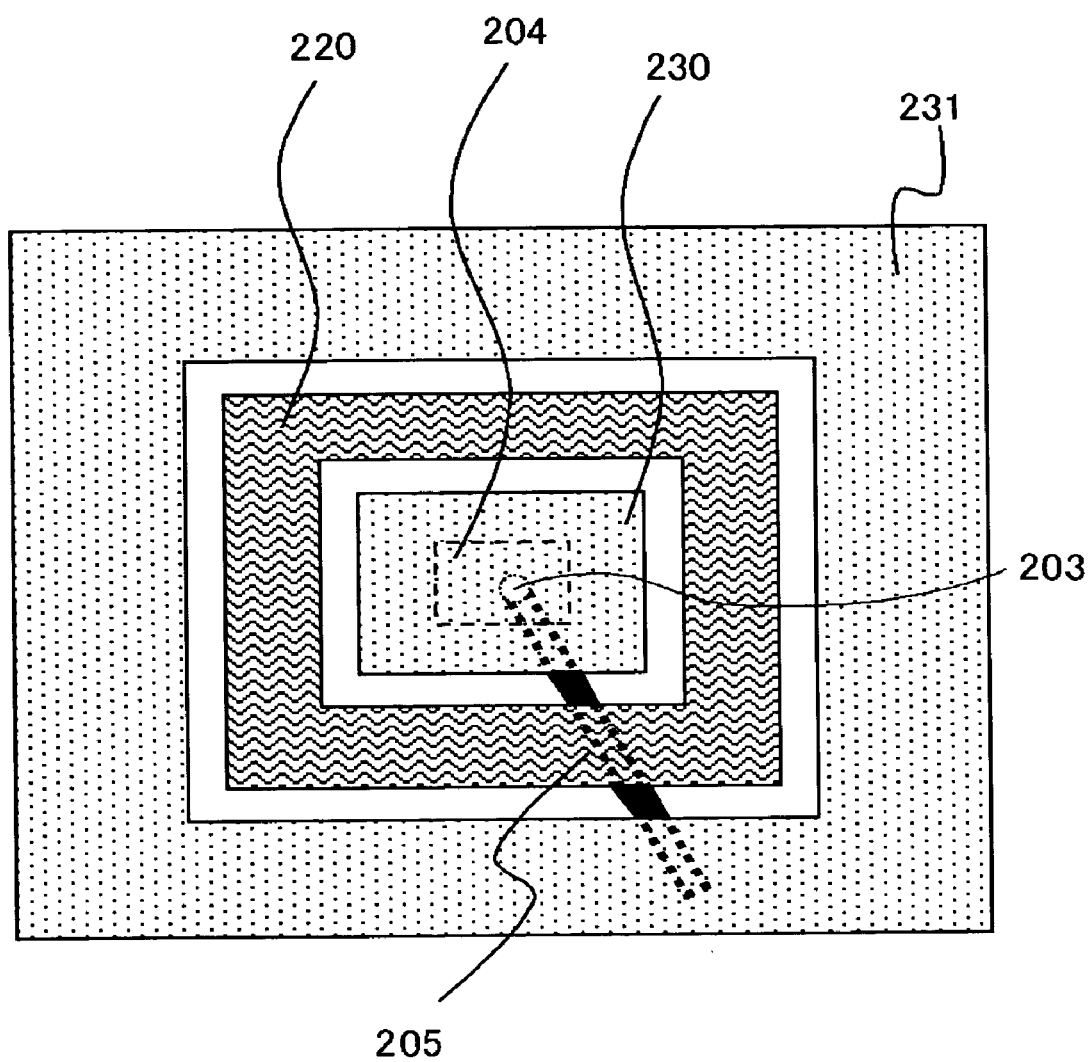
FIG. 10 is a plan view, showing a configuration of a transistor according to an embodiment.

FIG. 10 is a plan view, showing a transistor according to the present embodiment. In this arrangement, a drain electrode 231 is formed in a periphery of a source electrode 230 separately from the source electrode 230, so as to cover a circumference of the source electrode 230. A gate metallic film 220 is formed between the source electrode 230 and the drain electrode 231. A carbon nanotube 205 is formed so as to be connected to both the source electrode 230 and the drain electrode 231.

This carbon nanotube 205 grows from an origin of a metal fine particle 203 on a catalyst carrier film 204 along a horizontal direction within the substrate surface. When this arrangement is taken, an electrical connection of the source electrode 230 with the drain electrode 231 can be achieved, even though the carbon nanotube 205 grows along any direction. Here, a distance between the source electrode 230 and the drain electrode 231 may be appropriately selected taking into consideration of the growing condition of the carbon nanotube 205, so that the electrical connection by the carbon nanotube 205 can be further ensured.

In the transistor of FIG. 10, an electrode film for forming the source electrode 230 and the drain electrode 231 may be a monolayered film of gold, platinum, titanium or the like, or a multiple-layered film thereof. As for materials of the gate metallic film 220, one or more metal(s) such as aluminum, gold, titanium, tungsten or the like may be employed.

Next, an example of a method for manufacturing the transistor shown in FIG. 10 will be described.

First, a catalyst carrier film 204 is formed on a silicon substrate (not shown) having a silicon oxide film formed on the surface thereof. Here, the catalyst carrier film 204 may be formed as follows. A catalyst carrier material having a structure including TiN, aluminum and aluminum oxide formed in this sequence is formed on the surface of the silicon substrate, and a mask is formed thereon, and thereafter, the catalyst carrier material is patterned by a dry etching process. Here, TiN in the catalyst carrier film 204 is employed as aggregation film for providing an improved adhesiveness between the silicon oxide film on the surface of the substrate and aluminum thereon.

Subsequently, a metal fine particle 203 is fixed on the catalyst carrier film 204. The method for fixing the metal fine particle 203 may be conducted by using the method described in the aforementioned embodiments. The material for the metal fine particle 203 may be suitably selected from the materials for the catalyst for the carbon nanotube, and may be Fe, for example.

Subsequently, the substrate having the metal fine particle 203 fixed thereon is disposed in a CVD deposition chamber, and a source gas such as methane, acetylene and the like is supplied to allow the growth of the carbon nanotube 205 from the metal fine particle 203. The carbon nanotube 205 elongates along the horizontal direction within the surface of the substrate (FIG. 10). In order to allow a carbon nanotube 205 of a monolayered structure elongating along the horizontal direction within the surface of the substrate, it is critical to adequately select a material and a growing temperature for the metal fine particle 203.

Subsequently, a resist film is formed on the carbon nanotube 205, and a patterned resist including an opening is manufactured in regions where the source electrode 230 and the drain electrode 231 are to be provided via a lithography. Then, an electrode film is deposited over the entire surface of the substrate through a mask of the patterned resist. Then, the resist and the unwanted portions of the electrode film formed thereon are removed into a solvent that is capable of dissolving the resist via a lift-off technology. In this way, the source electrode 230 and the drain electrode 231 are formed.

Subsequently, a resist including an opening between the source electrode 230 and the drain electrode 231 is formed, and through a mask thereof, an insulating film (not shown) and a gate metallic film 220 are formed in this sequence. Thereafter, a stripping process for the resist mask is conducted by employing the solvent that is capable of dissolving the resist to remove the resist and the unwanted portions of the insulating film and the gate metallic film 220 formed thereon.

The transistor having the structure shown in FIG. 10 is obtained by the above-mentioned operations. In this transistor, an electrical connection between the source electrode 230 and the drain electrode 231 is provided by allowing the growth of the carbon nanotube 205 from the metal fine particle 203 along a horizontal direction. Consequently, electrical connection between both electrodes can be achieved with higher accuracy, as compared with a manner for disposing the carbon nanotubes dispersed into the solvent between the electrodes. In addition, the contact resistance between the carbon nanotube 205 and the electrode can be relatively reduced.

While the source electrode 230 and the drain electrode 231 contacting with the metal fine particle 203 are provided after fixing the metal fine particle 203 in the present embodiment, a manner for firstly forming the electrode, and thereafter fixing the metal fine particle 203 on surface of the electrode may also be employed. In this case, it is necessary to select the material and the thermal processing condition, so that the deterioration of the electrode material due to the thermal processing during the process for forming the metal fine particle 203 is avoided. When such manner is employed, the processing is conducted in the following procedure.

First, a patterned resist including an opening is manufactured in regions where the source electrode 230 and the drain electrode 231 are to be provided. Then, an electrode film is deposited over the entire surface of the substrate through a mask of the patterned resist. Then, the resist and the unwanted portions of the electrode film formed thereon are removed into a solvent that is capable of dissolving the resist via a lift-off technology. In this way, the source electrode 230 and the drain electrode 231 are formed. Next, a metal fine particle 203 is fixed on the source electrode 230. The method for fixing the metal fine particle 203 may be conducted by using the method described in the aforementioned embodiments. The material for the metal fine particle 203 may be suitably selected from the materials for the catalyst for the carbon nanotube, and may be Fe, for example. Thereafter, the carbon nanotube is allowed to grow similarly as in the above-described embodiments.

The present invention has been described above, based on the embodiments. It should be understood by those skilled in the art that these embodiments are presented for the purpose of the illustrations only, various modification may be possible, and these modifications are within the scope and spirit of the invention.

While the present invention will be further described in reference to examples as follows, the present invention is not limited thereto.

EXAMPLE 1

In the present example, a metal fine particle-adhered substrate was manufactured by the method described in first embodiment (FIG. 1 to FIG. 5), and a carbon nanotube was allowed to grow on the substrate by using thereof. A silicon oxide substrate was employed as a substrate 101. A resist composition employing in the formation of the resist film 102 containing 1.0 weight % of methyl acetoxy calix arene and 0.01 weight % of ferrocene dissolved in monochlorobenzene was prepared.

This resist solution was dropped on the silicon oxide substrate, and then a spin coating process was conducted at 4,000 revolutions per minute (rpm), and further was heated at 120 degree C. within a drying nitrogen atmosphere, and maintained as it was for one hour. As a result, a resist film 102 having a thickness of about 20 nm was obtained.

Subsequently, patterning for the resist film 102 on the substrate 101 by the electron beam exposure was conducted. In the present example, an electron beam that was accelerated to 50 keV was employed. Subsequently, the substrate 101 was immersed within xylene or acetone for 30 seconds to carry out the developing process. The electron beam exposure was conducted with a reasonable light exposure, and a patterned resist 103 schematically shown in FIG. 2 was able to be formed in the portion irradiated with the electron beam. The minimum size of the dot pattern was about 10 nm. This is almost the minimum processing size, in the current fine processing technology that can be industrially utilized.

Subsequently, the substrate with the patterned resist was thermally treated within a vacuum of equal to or lower than $10^{-4}$ Pa at 700 degree C. for one hour, and then the fine particle 104 formed by aggregating iron atoms and the graphitized region 105 containing substantially no iron were created (FIG. 4) in the patterned resist 103 schematically shown in FIG. 3. The heating temperature can be set to a temperature within a range of from around 400 degree C. to 800 degree C.

Further, an oxygen plasma processing for two minutes was conducted over the surface of the obtained substrate 101 to remove the carbon-containing resin contained in the patterned resist 103, thereby leaving one metal fine particle 106 on the substrate (FIG. 1). As a result of an observation of the substrate 101 via a scanning electron microscope (SEM), a fine particle having a particle diameter of several nm and being considered as iron was adhered on the substrate 101.

Thereafter, concerning the substrate 101 having the metal fine particle 106 adhered thereto, a growth of the carbon nanotube was conducted at 800 degree C. within a thermal decomposition methane gas flow. As a result, the presence of the carbon nanotube 107 that had grown from a basic point of the iron fine particle catalyst was confirmed (FIG. 5). The carbon nanotube 107 was a multiple-layer or a monolayered, and the outer diameter thereof was similar to the particle diameter of the metal fine particle 106. In addition, the diameter of the metal fine particle may be selected to be about 2 nm or smaller, so that a single phase nanotube would be obtained with an improved efficiency.

In addition, further investigations for the cases, in which both or one of the thermal treatment process and the oxygen plasma processing were omitted for processing the patterned resist, were conducted, and the results indicated that the monolayered and the a multiple-layered carbon nanotube growing from the basic points of a plurality of the iron fine particle catalysts were able to be confirmed in these cases.

EXAMPLE 2

In the present example, the patterning of the catalyst for allowing the growth of a carbon nanotube was conducted to the substrate via the FIB-CVD process described in seventh embodiment.

As a metallic compound, ferrocene, which is iron metallocene, was employed. First, a substrate was disposed within a sample holder in a vacuum apparatus that is capable of irradiating a focused ion beam. An Si substrate with an oxide film was employed for the substrate.

Solid ferrocene was heated to 65 degree C., and a vaporized gas thereof was sprayed directly on a surface of a substrate 120 through a nozzle, and $Ga^+$ focused ion beam of 30 keV accelerating voltage was irradiated over the same region. A partial pressure of ferrocene gas in the vacuum apparatus was about $10^{-3}$ Pa. In addition, a quantity of ionic current for applying was set to 1 pA, and this was irradiated over the substrate in a ferrocene gas atmosphere for 30 seconds, and then, a column-shaped deposit 123 having a diameter of 100 nm and a height of 1.5 µm is formed.

The deposit was a decomposed product of ferrocene, and contained iron atoms substantially uniformly dispersed in the amorphous carbon. Content of iron was around 10% by a composition ratio, and no fine particle consisting of iron atom was formed.

Then, the substrate containing the deposit was thermally treated at 600 degree C., and then, iron fine particles of about 10 nm were precipitated.

A growth of the carbon nanotube was directly conducted at 800 degree C. by a thermal decomposition methane gas flow employing the substrate with the iron containing deposit, and as a result, the presence of the multiple-layered and monolayered carbon nanotubes that had grown from a basic point of the iron fine particle catalyst was confirmed.

The invention claimed is:
1. A method for fixing a metal particle, including:
    forming a resist film containing a resin component and a metal-containing particle on a substrate; and
    removing said resin component in said resist film and fixing a metal particle on said substrate, said metal particle including a metallic element that composes said metal-containing particle,
    wherein said metal-containing particle is a metallic compound,
    wherein said metal particle is one per independent pattern, and
    wherein said method further includes heating said resist film to a temperature of 300 degree C. or higher and 1,200 degree C. or lower within a vacuum, after said forming the resist film and before said removing said resin component and fixing said metal particle.

2. The method for fixing the metal particle according to claim 1, wherein said removing said resin component and fixing said metal particle includes exposing said resist film to a plasma atmosphere.

3. The method for fixing the metal particle according to claim 1 or claim 2, wherein said removing said resin component and fixing said metal particle includes heating to a temperature of 300 degree C. of higher and 1,200 degree C. or lower within an oxygen gas atmosphere.

4. The method for fixing the metal particle according to any one of claims 1 or 2, wherein said resist film is a negative-type resist film.

5. The method for fixing the metal particle according to any one of claims 1 or 2, further comprising providing an electrode so as to contact with said metal particle, after fixing said metal particle.

6. The method for fixing the metal particle according to any one of claims 1 or 2,
wherein an electrode is provided on a surface of said substrate, and
wherein said fixing the metal particle includes aggregating the metal-containing particles in said resist film to fix said metal particle on a surface of said electrode.

7. The method for fixing the metal particle according to claim 1,
wherein said resist film is formed so as to cover the region where said metal particle is to be fixed, and
wherein said metal-containing particles in said resist film are aggregated to fix said metal particle to said region.

8. The method for fixing the metal particle according to claim 7, wherein said metal particle is fixed.

9. The method for fixing the metal particle according to any one of claims 1, 2 or 8, further including:
forming a diffusion barrier film on said substrate, before said forming the resist film, and
wherein said fixing the metal particle on said substrate includes fixing said metal particle on said diffusion barrier film.

10. The method for fixing the metal particle according to claim 8, wherein a particle diameter of said one metal particle is controlled by adjusting a concentration of the metallic element in said resist film.

11. The method for fixing the metal particle according to claim 10,
wherein said forming the resist film includes leaving a volume of said resist film on said substrate, and
wherein a particle diameter of said one metal particle is controlled by adjusting said volume of said resist film and a concentration of the metallic element in said resist film.

12. The method for fixing the metal particle according to claim 1, wherein said heating the resist film includes heating said resist film to a temperature of 400 degree C. or higher and 800 degree C. or lower within a vacuum.

13. The method for fixing the metal particle according to claim 1 or claim 12, wherein said heating the resist film includes heating said resist film within a vacuum.

14. The method for fixing the metal particle according to claim 1,
wherein said forming the resist film includes:
forming a first resist film that is free of said metal-containing particle; and
forming a second film containing said metal-containing particle after said forming the first resist film.

15. A method for fixing a metal particle, including:
forming a pattern containing a metal component by irradiating charged particle beam onto a substrate within an organic molecular gas atmosphere containing organometallic molecule to deposit a decomposition product of said organic molecular gas containing said metal component in the region where the charged particle beam is irradiated; and
removing the organic constituent in said pattern and fixing a metal particle containing said metal component on said substrate.

16. The method for fixing the metal particle according to claim 15, further including heating said pattern to a temperature of 300 degree C. or higher and 1,200 degree C. or lower within an inert gas atmosphere or a vacuum, after said forming the pattern containing the metal component and before said fixing the metal particle on the substrate.

17. The method for fixing the metal particle according to claim 15 or 16, wherein said removing the organic compound constituent in the pattern and fixing the metal particle includes exposing said pattern to a plasma atmosphere.

18. The method for fixing the metal particle according to any one of claims 15 or 16, further including:
providing an electrode so as to contact with said metal particle, after fixing said metal particle.

19. The method for fixing the metal particle according to any one of claims 15 or 16,
wherein an electrode is provided on a surface of said substrate, and
wherein said fixing the metal particle includes aggregating the metal-containing particles in said resist film to fix said metal particle on a surface of said electrode.

20. The method for fixing the metal particle according to claim 15 or claim 16, wherein said removing the organic compound constituent in the pattern and fixing the metal particle includes heating said pattern to a temperature of 300 degree C. or higher and 1,200 degree C. or lower within an oxygen gas atmosphere.

21. The method for fixing the metal particle according to claim 15,
wherein said pattern is formed so as to cover the region where said metal particle is to be fixed, and
wherein said metal-containing particles in said pattern is aggregated to fix said metal particle to said region.

22. The method for fixing the metal particle according to claim 21, wherein said metal particle is one per independent pattern and is fixed.

23. A method for manufacturing a substrate containing carbon nanotube on a surface thereof, including:
fixing a metal particle on the substrate; and
allowing a growth of a carbon nanotube by a vapor deposition process with a catalyst of said metal particle,
wherein said fixing said metal particle is conducted by the method for fixing the metal particle according to any one of claims 1, 2, 8, 15, 16 or 22.

24. A method for manufacturing a substrate containing a carbon nanotube on a surface thereof, including:
fixing a metal particle on the substrate;
disposing an amorphous carbon resin so as to cover said metal particle; and
transferring said metal particle in said amorphous carbon resin by heating said substrate having said amorphous carbon resin disposed thereon to allow the growth of the carbon nanotube in a region where said metal particle is transferred to form a locus, wherein said fixing said metal particle is conducted by the method for fixing the metal particle according to any one of claims 1, 2, 8, 15, 16 or 22.

25. The method for manufacturing a carbon nanotube-containing substrate according to claim 24,
wherein said disposing the amorphous carbon resin includes forming a predetermined geometry of a patterned amorphous carbon resin on said substrate, and
wherein said allowing the growth of the carbon nanotube includes moving said metal particle within said patterned amorphous carbon resin to allow the growth of said carbon nanotube, thereby forming a graphite pattern.

26. A method for manufacturing a substrate containing a semiconductor crystal rod on a surface thereof, including:
fixing a metal particle on the substrate; and
allowing a growth of a crystalline rod of a semiconductor by a vapor deposition process with a catalyst of said metal particle,
wherein said fixing said metal particle is conducted by the method for fixing the metal particle according to any one of claims 1, 2, 8, 15, 16 or 22.

27. The method for fixing the metal particle according to claim 22, wherein a particle diameter of said one metal particle is controlled by adjusting a concentration of the metallic element in said pattern.

28. The method for fixing the metal particle according to claim 27,
wherein said forming the pattern includes depositing a volume of said pattern on said substrate, and
wherein a particle diameter of said one metal particle is controlled by adjusting said volume of said pattern and a concentration of the metallic element in said pattern.

29. A method for manufacturing a substrate containing a carbon nanotube on a surface thereof, including:
fixing a metal particle on the substrate; and
allowing a growth of a carbon nanotube by a vapor deposition process with a catalyst of said metal particle,
wherein said fixing said metal particle is conducted by the method for fixing the metal particle according to any one of claims 10 to 28.

30. A method for manufacturing a substrate containing a semiconductor crystal rod on a surface thereof, including:
fixing a metal particle on the substrate; and
allowing a growth of a crystalline rod of a semiconductor by a vapor deposition process with a catalyst of said metal particle,
wherein said fixing said metal particle is conducted by the method for fixing the metal particle according to any one of claims 10 to 28.

31. A method for manufacturing a metal particle-containing substrate, including the method for fixing the metal particle according to any one of claims 1, 2, 8, 15, 16 or 22.

* * * * *